US008772064B2

(12) United States Patent
Takagi et al.

(10) Patent No.: US 8,772,064 B2
(45) Date of Patent: *Jul. 8, 2014

(54) GROUP-III NITRIDE SEMICONDUCTOR LASER DEVICE, AND METHOD OF FABRICATING GROUP-III NITRIDE SEMICONDUCTOR LASER DEVICE

(75) Inventors: Shimpei Takagi, Osaka (JP); Yusuke Yoshizumi, Itami (JP); Koji Katayama, Osaka (JP); Masaki Ueno, Itami (JP); Takatoshi Ikegami, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 93 days.

This patent is subject to a terminal disclaimer.

(21) Appl. No.: 13/289,507

(22) Filed: Nov. 4, 2011

(65) Prior Publication Data
US 2012/0100654 A1    Apr. 26, 2012

Related U.S. Application Data

(62) Division of application No. 12/837,269, filed on Jul. 15, 2010, now Pat. No. 8,401,048.

(30) Foreign Application Priority Data

Dec. 25, 2009  (JP) ................ 2009-295567

(51) Int. Cl.
*H01L 21/8252* (2006.01)
*H01L 21/18* (2006.01)
*H01S 5/343* (2006.01)
*H01S 5/10* (2006.01)
*H01S 5/02* (2006.01)
*H01S 5/32* (2006.01)
*H01S 5/16* (2006.01)

(52) U.S. Cl.
CPC ......... *H01S 5/34333* (2013.01); *H01S 5/1082* (2013.01); *H01S 5/1085* (2013.01); *H01S 5/0202* (2013.01); *H01S 5/3202* (2013.01); *H01S 5/16* (2013.01)
USPC ............... 438/33; 438/46; 257/E33.025

(58) Field of Classification Search
CPC . H01S 5/34333; H01S 5/1085; H01S 5/1082; H01S 5/0202; H01S 5/3202; H01S 5/16
USPC ................ 438/33, 46; 257/E33.025
See application file for complete search history.

(56) References Cited

U.S. PATENT DOCUMENTS 7,501,667 B2  3/2009  Hasegawa et al.
7,933,303 B2 *  4/2011  Yoshizumi et al. ...... 372/44.011
(Continued)

FOREIGN PATENT DOCUMENTS

CN    101361238 A    2/2009
JP    2001-230497    8/2001
(Continued)

OTHER PUBLICATIONS

Tyagi, A. et al. "Semipolar (10-1-1) InGaN/GaN Laser Diodes on Bulk GaN Substrates," Japanese Journal of Applied Physics, vol. 46, No. 19, pp. L444-L445 (2007).
(Continued)

*Primary Examiner* — Mary Wilczewski
(74) *Attorney, Agent, or Firm* — Venable LLP; Michael A. Sartori; Tamatane J. Aga

(57) ABSTRACT

A method of fabricating a III-nitride semiconductor laser device includes: preparing a substrate having a hexagonal III-nitride semiconductor and having a semipolar primary surface; forming a substrate product having a laser structure, an anode electrode and a cathode electrode, the laser structure including a substrate and a semiconductor region formed on the semipolar primary surface; scribing a first surface of the substrate product in part in a direction of the a-axis of the hexagonal III-nitride semiconductor; and carrying out breakup of the substrate product by press against a second surface of the substrate product, to form another substrate product and a laser bar.

12 Claims, 22 Drawing Sheets

(56) References Cited

U.S. PATENT DOCUMENTS

| | | | |
|---|---|---|---|
| 8,071,405 B2* | 12/2011 | Takagi et al. | 438/33 |
| 8,076,167 B2* | 12/2011 | Takagi et al. | 438/33 |
| 8,105,857 B2* | 1/2012 | Takagi et al. | 438/33 |
| 8,139,619 B2* | 3/2012 | Takagi et al. | 372/44.011 |
| 8,175,129 B2* | 5/2012 | Yoshizumi et al. | 372/45.01 |
| 8,213,475 B2* | 7/2012 | Takagi et al. | 372/45.01 |
| 8,227,277 B2* | 7/2012 | Yoshizumi et al. | 438/33 |
| 8,265,113 B2* | 9/2012 | Yoshizumi et al. | 372/44.01 |
| 8,306,082 B2* | 11/2012 | Yoshizumi et al. | 372/44.011 |
| 8,361,885 B2* | 1/2013 | Yoshizumi et al. | 438/462 |
| 8,389,312 B2* | 3/2013 | Yoshizumi et al. | 438/33 |
| 8,401,048 B2* | 3/2013 | Takagi et al. | 372/44.011 |
| 8,420,419 B2* | 4/2013 | Takagi et al. | 438/33 |
| 8,507,305 B2* | 8/2013 | Yoshizumi et al. | 438/47 |
| 8,546,163 B2* | 10/2013 | Yoshizumi et al. | 438/33 |
| 2003/0030053 A1 | 2/2003 | Kawakami et al. | |
| 2005/0030994 A1 | 2/2005 | Kozaki et al. | |
| 2005/0269584 A1 | 12/2005 | Hasegawa et al. | |
| 2008/0230766 A1 | 9/2008 | Okamoto et al. | |
| 2009/0059983 A1 | 3/2009 | Hasegawa et al. | |
| 2009/0262771 A1 | 10/2009 | Inoue et al. | |
| 2010/0230690 A1 | 9/2010 | Kyono et al. | |
| 2010/0230691 A1 | 9/2010 | Kyono et al. | |
| 2010/0260224 A1 | 10/2010 | Yoshizumi et al. | |
| 2011/0075694 A1* | 3/2011 | Yoshizumi et al. | 372/45.01 |
| 2011/0075695 A1* | 3/2011 | Yoshizumi et al. | 372/45.011 |
| 2011/0158277 A1* | 6/2011 | Yoshizumi et al. | 372/44.011 |
| 2011/0164637 A1* | 7/2011 | Yoshizumi et al. | 372/44.011 |
| 2011/0228804 A1* | 9/2011 | Yoshizumi et al. | 372/44.011 |
| 2011/0299560 A1* | 12/2011 | Takagi et al. | 372/44.011 |
| 2012/0058583 A1* | 3/2012 | Yoshizumi et al. | 438/33 |
| 2012/0100654 A1* | 4/2012 | Takagi et al. | 438/46 |
| 2012/0142130 A1* | 6/2012 | Yoshizumi et al. | 438/33 |
| 2012/0184057 A1* | 7/2012 | Yoshizumi et al. | 438/29 |
| 2012/0202304 A1* | 8/2012 | Yoshizumi et al. | 438/33 |
| 2012/0214268 A1* | 8/2012 | Takagi et al. | 438/33 |
| 2012/0258557 A1* | 10/2012 | Yoshizumi et al. | 438/33 |
| 2012/0269220 A1* | 10/2012 | Kyono et al. | 372/45.01 |
| 2013/0051417 A1* | 2/2013 | Sumitomo et al. | 372/44.011 |

FOREIGN PATENT DOCUMENTS

| | | |
|---|---|---|
| JP | 2003-017791 | 1/2003 |
| JP | 2004-241515 | 8/2004 |
| JP | 2005-159278 A | 6/2005 |
| JP | 2005-353690 A | 12/2005 |
| JP | 2007-184353 A | 7/2007 |
| JP | 2008-235804 A | 10/2008 |
| JP | 2009-081336 | 4/2009 |
| JP | 2009-170798 | 7/2009 |
| JP | 2009-259864 | 11/2009 |
| JP | 4375497 B1 | 12/2009 |
| JP | 4475357 B1 | 6/2010 |
| WO | WO-2008/016019 A1 | 2/2008 |
| WO | WO-2009/125731 | 10/2009 |

OTHER PUBLICATIONS

Office Action issued in Chinese Patent Application No. 201080059085.0 dated May 16, 2013.

* cited by examiner

Fig.2
(a)
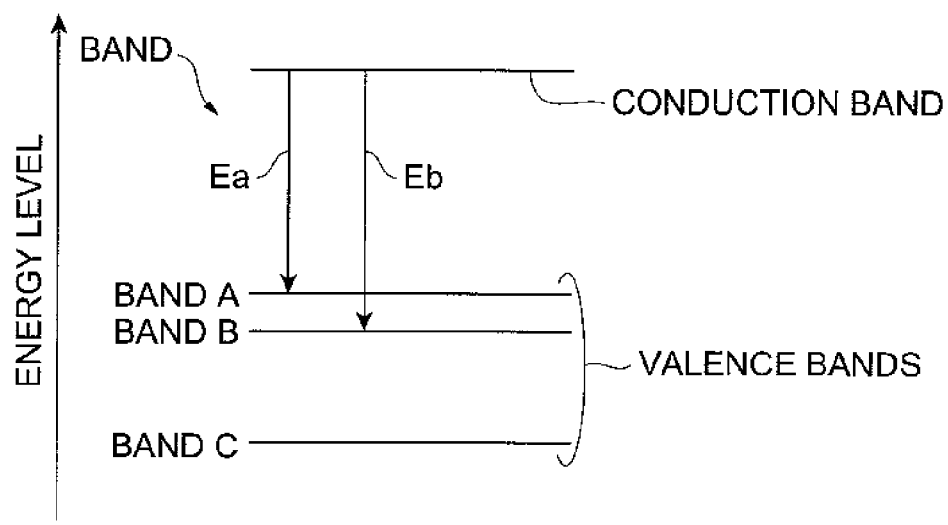
(b)
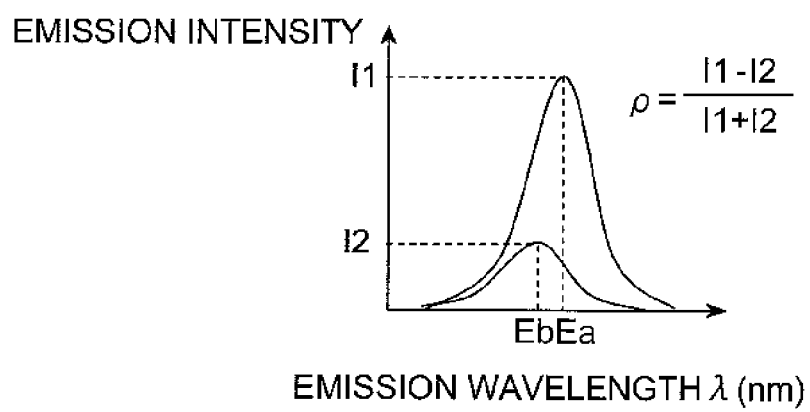

Fig.7
(a)
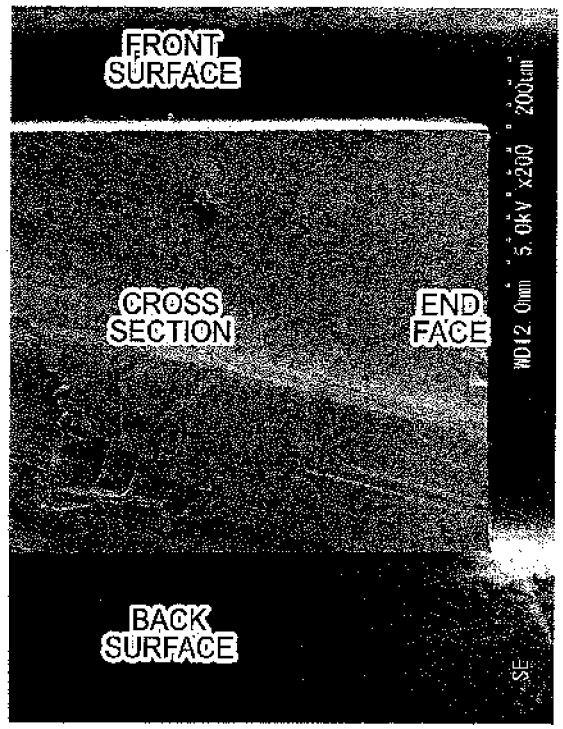
(b)
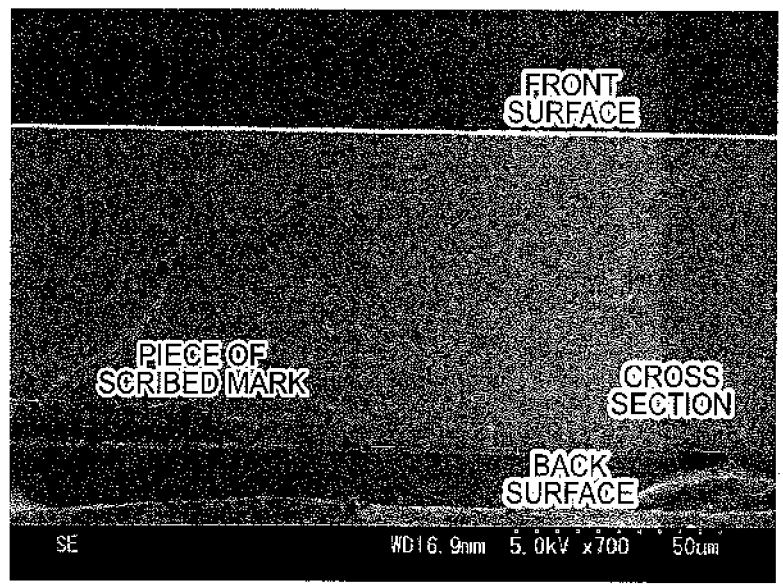

Fig.10
(a)
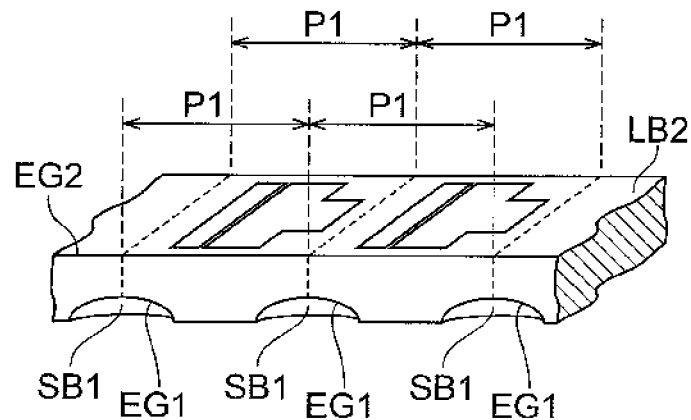
(b)
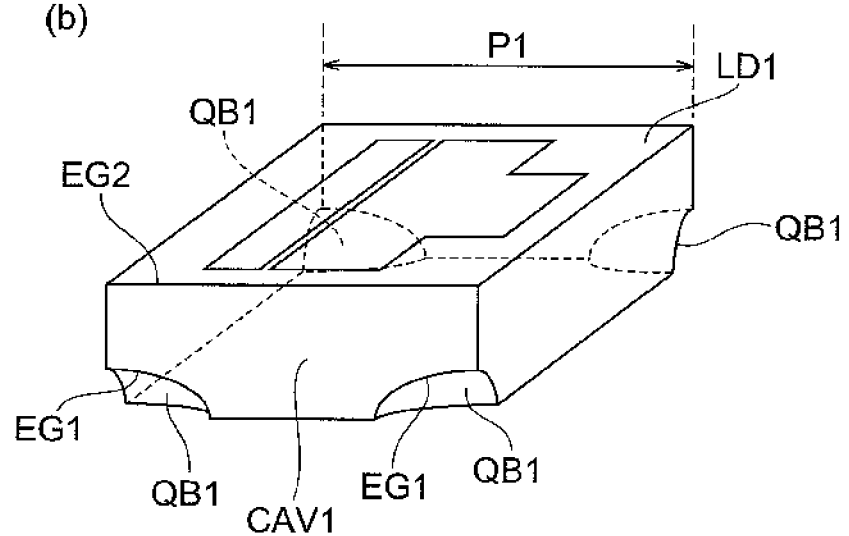

Fig.11
(a)
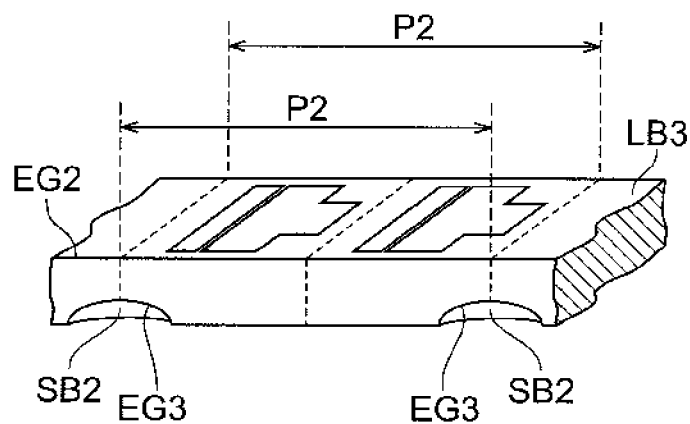
(b)
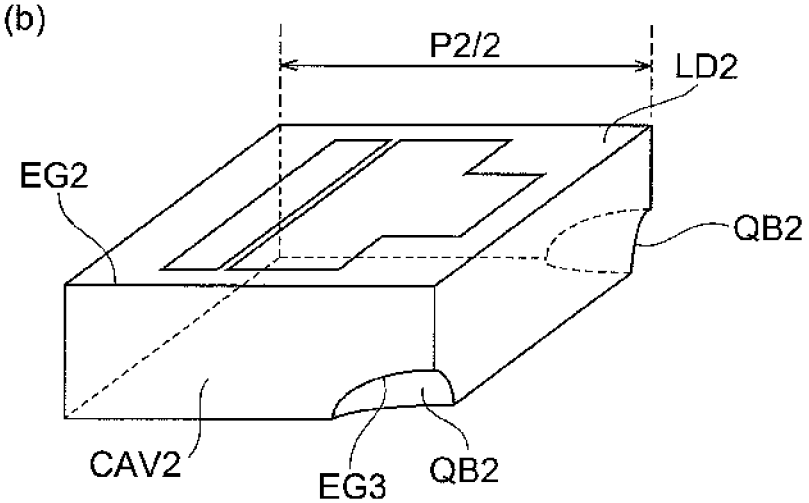

Fig.12
(a)
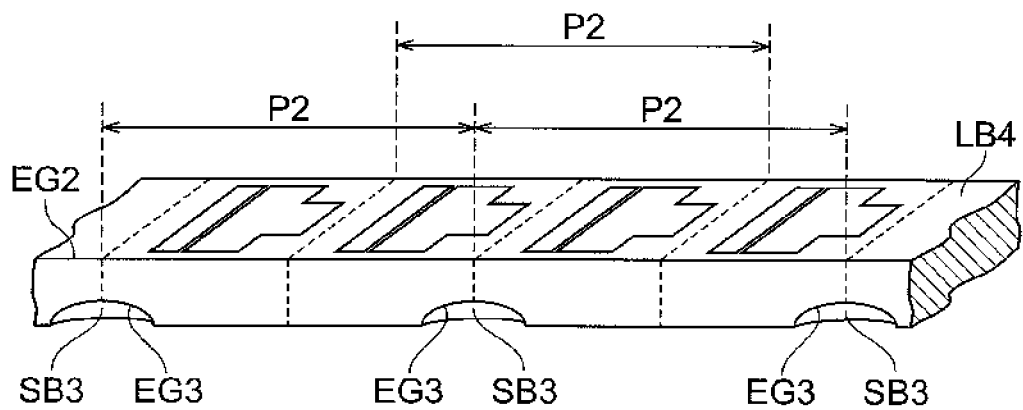
(b)
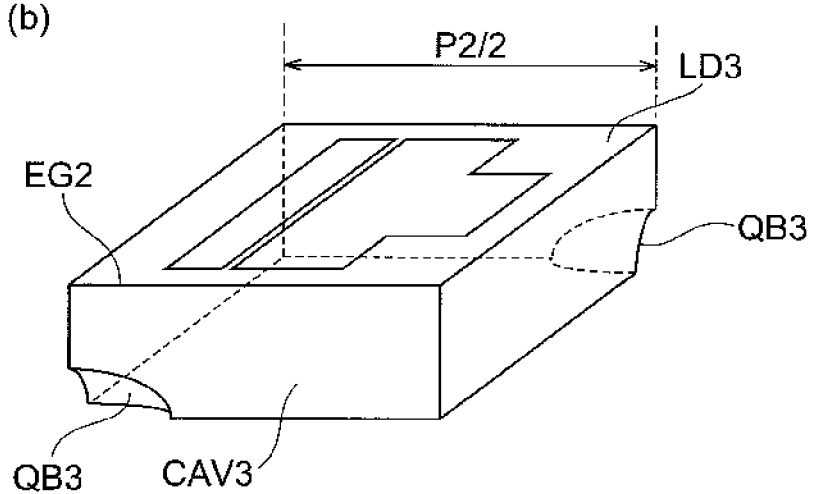

Fig.19

| HEXAGONAL GaN | | | | | | | | | | |
|---|---|---|---|---|---|---|---|---|---|---|
| | a | c | h1 | k1 | l1 | h2 | k2 | l2 | cos θ | Arccos(rad) | (deg) |
| PLANE INDICES OF PLANES PERPENDICULAR TO (20-21) | 3.189 | 5.185 | -1 | 0 | 1 | 2 | 0 | 1 | -0.7 | 2.4 | 137.05 |
| | 3.189 | 5.185 | -1 | 0 | 2 | 2 | 0 | 1 | -0.5 | 2.1 | 118.28 |
| | 3.189 | 5.185 | -1 | 0 | 3 | 2 | 0 | 1 | -0.3 | 1.9 | 107.13 |
| | 3.189 | 5.185 | -1 | 0 | 4 | 2 | 0 | 1 | -0.2 | 1.7 | 100.23 |
| | 3.189 | 5.185 | -1 | 0 | 5 | 2 | 0 | 1 | -0.1 | 1.7 | 95.67 |
| | 3.189 | 5.185 | -1 | 0 | 6 | 2 | 0 | 1 | 0.0 | 1.6 | 92.46 |
| | 3.189 | 5.185 | -1 | 0 | 7 | 2 | 0 | 1 | 0.0 | 1.6 | 90.10 |
| | 3.189 | 5.185 | -1 | 0 | 8 | 2 | 0 | 1 | 0.0 | 1.5 | 88.29 |
| | 3.189 | 5.185 | -1 | 0 | 9 | 2 | 0 | 1 | 0.1 | 1.5 | 86.87 |
| | 3.189 | 5.185 | -1 | 0 | 10 | 2 | 0 | 1 | 0.1 | 1.5 | 85.72 |
| | 3.189 | 5.185 | -2 | 0 | 1 | 2 | 0 | 1 | -0.9 | 2.6 | 150.17 |
| | 3.189 | 5.185 | -2 | 0 | 2 | 2 | 0 | 1 | -0.7 | 2.4 | 137.05 |
| | 3.189 | 5.185 | -2 | 0 | 3 | 2 | 0 | 1 | -0.6 | 2.2 | 126.46 |
| | 3.189 | 5.185 | -2 | 0 | 4 | 2 | 0 | 1 | -0.5 | 2.1 | 118.28 |
| | 3.189 | 5.185 | -2 | 0 | 5 | 2 | 0 | 1 | -0.4 | 2.0 | 111.99 |
| | 3.189 | 5.185 | -2 | 0 | 6 | 2 | 0 | 1 | -0.3 | 1.9 | 107.13 |
| | 3.189 | 5.185 | -2 | 0 | 7 | 2 | 0 | 1 | -0.2 | 1.8 | 103.30 |
| | 3.189 | 5.185 | -2 | 0 | 8 | 2 | 0 | 1 | -0.2 | 1.7 | 100.23 |
| | 3.189 | 5.185 | -2 | 0 | 9 | 2 | 0 | 1 | -0.1 | 1.7 | 97.73 |
| | 3.189 | 5.185 | -2 | 0 | 10 | 2 | 0 | 1 | -0.1 | 1.7 | 95.67 |
| | 3.189 | 5.185 | -3 | 0 | 1 | 2 | 0 | 1 | -0.9 | 2.7 | 155.02 |
| | 3.189 | 5.185 | -3 | 0 | 2 | 2 | 0 | 1 | -0.8 | 2.5 | 145.54 |
| | 3.189 | 5.185 | -3 | 0 | 3 | 2 | 0 | 1 | -0.7 | 2.4 | 137.05 |
| | 3.189 | 5.185 | -3 | 0 | 4 | 2 | 0 | 1 | -0.6 | 2.3 | 129.71 |
| | 3.189 | 5.185 | -3 | 0 | 5 | 2 | 0 | 1 | -0.6 | 2.2 | 123.49 |
| | 3.189 | 5.185 | -3 | 0 | 6 | 2 | 0 | 1 | -0.5 | 2.1 | 118.28 |
| | 3.189 | 5.185 | -3 | 0 | 7 | 2 | 0 | 1 | -0.4 | 2.0 | 113.91 |
| | 3.189 | 5.185 | -3 | 0 | 8 | 2 | 0 | 1 | -0.3 | 1.9 | 110.23 |
| | 3.189 | 5.185 | -3 | 0 | 9 | 2 | 0 | 1 | -0.3 | 1.9 | 107.13 |
| | 3.189 | 5.185 | -3 | 0 | 10 | 2 | 0 | 1 | -0.2 | 1.8 | 104.48 |

→ (-1016) PLANE
→ (-1017) PLANE
→ (-1018) PLANE

GROUP-III NITRIDE SEMICONDUCTOR LASER DEVICE, AND METHOD OF FABRICATING GROUP-III NITRIDE SEMICONDUCTOR LASER DEVICE

CROSS-REFERENCE TO RELATED APPLICATIONS

This application is a Divisional of U.S. patent application Ser. No. 12/837,269, filed Jul. 15, 2010 now U.S. Pat. No. 8,401,048, which claims the benefit of Japanese Patent Application No. 2009-295567, filed Dec. 25, 2009, all of which are incorporated by reference in their entirety.

BACKGROUND OF THE INVENTION

1. Field of the Invention

The present invention relates to a III-nitride semiconductor laser device, and a method of fabricating the III-nitride semiconductor laser device.

2. Related Background Art

Patent Literature 1 discloses a laser device. When a primary surface of a substrate is a face inclined at 28.1 degrees from a {0001} plane toward a direction equivalent to the [1-100] direction, secondary cleaved facets are {11-20} planes perpendicular to both of the primary surface and optical cavity faces, and the laser device is of a rectangular parallelepiped shape.

Patent Literature 2 discloses a nitride semiconductor device. The back surface of the substrate for cleavage is polished to reduce the total thickness to about 100 μm. A dielectric multilayer film is deposited on cleaved facets.

Patent Literature 3 discloses a nitride-based compound semiconductor device. The substrate used for the nitride-based compound semiconductor device is comprised of a nitride-based compound semiconductor with the threading dislocation density of not more than $3\times10^6$ cm$^{-2}$ and the in-plane threading dislocation density is substantially uniform.

Patent Literature 4 discloses a nitride-based semiconductor laser device. In the nitride-based semiconductor laser device, cleaved facets are formed as described below. With respect to recesses which are made by etching from layers for the semiconductor laser device to an n-type GaN substrate, scribed grooves are formed using a laser scriber and arranged like a dashed line (at intervals of about 40 μm) in a direction orthogonal to an extending direction of ridge portions, while avoiding projections made during the etching of cavity faces on the n-type GaN substrate. Then the wafer is cleaved at positions of the scribed grooves. On this occasion, each of regions without the scribed grooves, e.g., each projection, is cleaved from the adjacent scribed groove as an origin. As a result, device separation faces are formed as a cleaved facet of a (0001) plane of the n-type GaN substrate.

Patent Literature 5 discloses a light emitting device. The light emitting device is able to readily emit light at a long wavelength, without deterioration of luminous efficiency in its light emitting layer.

Patent Literature 6 discloses a nitride semiconductor device of an opposed electrode structure with reduced contact resistance. A nitride semiconductor substrate has first and second primary surfaces. The nitride semiconductor substrate includes a region whose crystal growth surface of a (0001) plane. A nitride semiconductor layer is grown on the first primary surface of the nitride semiconductor substrate. Grooves are formed in a second region of the second primary surface. The device has a stripe of a ridge shape above the first primary surface of the nitride semiconductor substrate. An optical cavity is produced by cleavage.

Non-patent Literature 1 discloses a semiconductor laser, formed on a semipolar (10-11) plane, in which a waveguide extends in an off-axis direction and in which mirrors for an optical cavity are made by reactive ion etching Patent Literature 1: Japanese Patent Application Laid-open No. 2001-230497

Patent Literature 2: Japanese Patent Application Laid-open No. 2005-353690

Patent Literature 3: Japanese Patent Application Laid-open No. 2007-184353

Patent Literature 4: Japanese Patent Application Laid-open No. 2009-081336

Patent Literature 5: Japanese Patent Application Laid-open No. 2008-235804

Patent Literature 6: Japanese Patent Application Laid-open No. 2005-159278

Non-patent Literature 1: Jpn. J. Appl. Phys. Vol. 46, No. 19, (2007) L444

SUMMARY OF THE INVENTION

The band structure of a gallium nitride (GaN)-based semiconductor has some possible transitions capable of lasing. According to Inventors' knowledge, it is considered that in the III-nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the cavity mirrors. For this reason, the cavity mirrors have been made heretofore by forming dry-etched facets of semiconductor layers by reactive ion etching (RIE). There are now desires for improvement in the cavity mirrors formed by RIE, in terms of perpendicularity to the laser waveguide, flatness of the dry-etched facets, or ion damage. It becomes a heavy burden to derive process conditions for obtaining good dry-etched facets in the current technical level.

As far as the inventors know, in the III-nitride semiconductor laser device formed on the semipolar plane, no one has succeeded heretofore in achieving both of the laser waveguide extending in the inclination direction (off-axis direction) of the c-axis and the end faces for cavity mirrors formed without use of dry etching.

On the other hand, in fabrication of the III-nitride semiconductor laser device on a c-plane, when the cavity mirrors are formed of conventional cleaved facets, the cleaved facets have been made by forming scribed grooves on a thin film of the epi-side and pressing a blade against the back surface of the substrate. However, as described above, where the laser waveguide is directed so as to extend in the inclination direction (off-axis direction) of the c-axis, the cavity mirrors cannot be produced by making use of the conventional cleaved facets. According to Inventors' knowledge, end faces different from the cleaved facets can be used as the cavity mirrors in the III-nitride semiconductor laser devices using the semipolar-plane substrate the c-axis of which is inclined toward the m-axis. The end faces are made by forming scribed grooves on the epi-side composed of thin films and implementing the press on the back side of the substrate. The inventors have investigated the end faces made by this method, so as to achieve improvement toward better quality for the cavity mirrors. The present invention has been accomplished in view of the above-described circumstances. The applicant filed a Japanese patent application (Japanese Patent Application No. 2009-144442) related to the III-nitride semiconductor laser device including fractured faces for the optical cavity.

It is an object of the present invention to provide a III-nitride semiconductor laser device with a laser cavity, which enables a low threshold current and exhibits high quality for the cavity mirrors, on a semipolar plane of a support base inclined from the c-axis toward the m-axis of a hexagonal III-nitride, and to provide a method for fabricating the III-nitride semiconductor laser device.

A III-nitride semiconductor laser device according to an aspect of the present invention comprises: (a) a laser structure including a support base and a semiconductor region, the support base being comprised of a hexagonal III-nitride semiconductor and having a semipolar primary surface, and the semiconductor region being provided on the semipolar primary surface of the support base; and (b) an electrode provided on the semiconductor region of the laser structure. The semiconductor region comprises a first cladding layer of a first conductivity type GaN-based semiconductor, a second cladding layer being of a second conductivity type GaN-based semiconductor, and an active layer provided between the first cladding layer and the second cladding layer; the first cladding layer, the second cladding layer, and the active layer are arranged along an axis normal to the semipolar primary surface: the active layer comprises a GaN-based semiconductor layer; a c-axis of the hexagonal III-nitride semiconductor of the support base is inclined at a finite angle ALPHA with respect to the normal axis toward an m-axis of the hexagonal III-nitride semiconductor, and the angle ALPHA being in one of a range of not less than 45 degrees and not more than 80 degrees and a range of not less than 100 degrees and not more than 135 degrees; the laser structure comprises first and second fractured faces, the first and second fractured faces intersecting with an m-n plane defined by the m-axis of the hexagonal III-nitride semiconductor and the normal axis; a laser cavity of the III-nitride semiconductor laser device comprises the first and second fractured faces; the laser structure comprises first and second surfaces, and the first surface is opposite to the second surface; the semiconductor region is located between the second surface and the support base; each of the first and second fractured faces extends from an edge of the first surface to an edge of the second surface; and the support base of the laser structure has a recess in the first fractured face, the recess being located at a portion of the edge of the first surface, the recess extending from a back surface of the support base, and an end of the recess being located apart from the edge of the second surface of the laser structure.

In this III-nitride semiconductor laser device, because the first and second fractured faces that form the laser cavity intersect with the m-n plane defined by the normal axis and the m-axis of the hexagonal III-nitride semiconductor, it is feasible to provide a laser waveguide extending in a direction of an intersecting line between the m-n plane and the semipolar surface. The present invention, therefore, succeeds in providing the III-nitride semiconductor laser device with the laser cavity enabling a low threshold current.

When the angle is in the range of less than 45 degrees or in the range of more than 135 degrees, end faces made by press are highly likely to be comprised of m-planes. When the angle is in the range of more than 80 degrees and less than 100 degrees, it may result in failing to achieve desired flatness and perpendicularity.

Furthermore, the recess corresponding to one piece of a scribed mark extends from the back surface of the support base, and the end of the recess is located apart from the edge of the second surface (epitaxial surface) of the semiconductor region. For this reason, an end face of the active layer exposed in the fractured face is provided with excellent flatness. It is also considered that the recess guides fracture, the fracture produces significant bending moment in the semiconductor on the epi-side of the semiconductor laminate including the active layer, and this moment distribution improves the quality of the fractured face.

In the III-nitride semiconductor laser device according to the present invention, a thickness of the support base is preferably not more than 400 µm. This III-nitride semiconductor laser device is suitable for obtaining an excellent-quality fractured face for the laser cavity.

In the III-nitride semiconductor laser device according to the present invention, more preferably, the thickness of the support base is not less than 50 µm and not more than 100 µm. When the thickness is not less than 50 µm, the handling becomes easier and production yield becomes higher. When the thickness is not more than 100 µm, it is more suitable for obtaining an excellent-quality fractured face for the laser cavity.

In the III-nitride semiconductor laser device according to the present invention, the recess of the laser structure can reach the semiconductor region.

In the III-nitride semiconductor laser device according to the present invention, more preferably, the angle between the normal axis and the c-axis of the hexagonal III-nitride semiconductor is in the range of not less than 63 degrees and not more than 80 degrees or in the range of not less than 100 degrees and not more than 117 degrees.

In this III-nitride semiconductor laser device, when the angle is in the range of not less than 63 degrees and not more than 80 degrees or in the range of not less than 100 degrees and not more than 117 degrees, end faces made by press are highly likely to be faces nearly perpendicular to the primary surface of the substrate. When the angle is in the range of more than 80 degrees and less than 100 degrees, it may result in failing to achieve desired flatness and perpendicularity.

In the III-nitride semiconductor laser device according to the present invention, laser light from the active layer is polarized in a direction of the a-axis of the hexagonal III-nitride semiconductor. In this III-nitride semiconductor laser device, a band transition allowing for achievement of a low threshold current has polarized nature.

In the III-nitride semiconductor laser device according to the present invention, light in the LED mode in the III-nitride semiconductor laser device includes a polarization component I1 in a direction of the a-axis of the hexagonal III-nitride semiconductor, and a polarization component I2 in a projected direction of the c-axis of the hexagonal III-nitride semiconductor on the primary surface, and the polarization component I1 is greater than the polarization component I2. This III-nitride semiconductor laser device can lase with the laser cavity to emit light in a mode with large emission intensity in the LED mode.

In the III-nitride semiconductor laser device according to the present invention, preferably, the semipolar primary surface is one of a {20-21} plane, a {10-11} plane, a {20-2-1} plane, and a {10-1-1} plane.

This III-nitride semiconductor laser device allows for provision of first and second end faces on these typical semipolar planes, and the first and second end faces have flatness and perpendicularity enough to construct the laser cavity of the III-nitride semiconductor laser device.

In the III-nitride semiconductor laser device according to the present invention, the semipolar primary surface also suitably applicable is a surface with a slight slant in the range of not less than −4 degrees and not more than +4 degrees with respect to any one semipolar plane of a {20-21} plane, a {10-11} plane, a {20-2-1} plane, and a {10-1-1} plane, toward an m-plane.

This III-nitride semiconductor laser device allows for provision of the first and second end faces on the slight slant surface from these typical semipolar planes, and the first and second end faces have flatness and perpendicularity enough to construct the laser cavity of the III-nitride semiconductor laser device.

In the III-nitride semiconductor laser device according to the present invention, preferably, a stacking fault density of the support base is not more than $1 \times 10^4$ cm$^{-1}$.

In this III-nitride semiconductor laser device, because the stacking fault density is not more than $1 \times 10^4$ cm$^{-1}$, the flatness and/or perpendicularity of the fractured faces is less likely to vary because of a certain accidental reason.

In the III-nitride semiconductor laser device according to the present invention, the support base can be comprised of any one of GaN, AlGaN, AlN, InGaN, and InAlGaN.

In this III-nitride semiconductor laser device, when the substrate used is made of one of these GaN-based semiconductors, it becomes feasible to obtain the first and second end faces applicable to the cavity. Use of an AlN substrate or AlGaN substrate allows for increase in degree of polarization and enhancement of optical confinement by virtue of low refractive index. Use of an InGaN substrate allows for decrease in lattice mismatch rate between the substrate and the light emitting layer and improvement in crystal quality.

The III-nitride semiconductor laser device according to the present invention can further comprise a dielectric multilayer film provided on at least one of the first and second fractured faces.

In this III-nitride semiconductor laser device, an end face coat is also applicable to the fractured faces. The end face coat allows for adjustment of reflectance.

In the III-nitride semiconductor laser device according to the present invention, the active layer can include a quantum well structure provided so as to generate light at a wavelength of not less than 360 nm and not more than 600 nm. Since this III-nitride semiconductor laser device makes use of the semipolar plane, the resultant device is the III-nitride semiconductor laser device making efficient use of polarization in the LED mode and achieves a low threshold current.

In the III-nitride semiconductor laser device according to the present invention, more preferably, the active layer includes a quantum well structure provided so as to generate light at a wavelength of not less than 430 nm and not more than 550 nm. Since this III-nitride semiconductor laser device makes use of the semipolar plane, it allows for increase in quantum efficiency through decrease of the piezoelectric field and improvement in crystal quality of the light emitting layer region and it is thus suitable for generation of light at the wavelength of not less than 430 nm and not more than 550 nm.

In the III-nitride semiconductor laser device according to the present invention, an end face of the support base and an end face of the semiconductor region are exposed in each of the first and second fractured faces, and an angle between the end face of the semiconductor region in the active layer and a reference plane perpendicular to the m-axis of the support base of the hexagonal nitride semiconductor is in the range of not less than (ALPHA−5) degrees and not more than (ALPHA+5) degrees on a first plane defined by the c-axis and the m-axis of the III-nitride semiconductor.

This III-nitride semiconductor laser device has the end faces satisfying the foregoing perpendicularity, concerning the angle taken from one to the other of the c-axis and the m-axis.

In the III-nitride semiconductor laser device according to the present invention, preferably, the angle is in the range of not less than −5 degrees and not more than +5 degrees on a second plane perpendicular to the first plane and the normal axis.

This III-nitride semiconductor laser device has the end faces satisfying the foregoing perpendicularity, concerning the angle defined on the plane perpendicular to the normal axis to the semipolar surface.

In the III-nitride semiconductor laser device according to the present invention, the electrode extends in a direction of a predetermined axis, and the first and second fractured faces intersect with the predetermined axis.

The III-nitride semiconductor laser device according to the present invention can be configured as follows; the laser structure has a pair of side faces for the III-nitride semiconductor laser device, and the recess is located at the one end in the pair of side faces.

In this III-nitride semiconductor laser device, the recess is comprised of one piece of a scribed mark, and this recess is located at one end in the pair of side faces; therefore, the laser stripe in the laser structure is located apart from a scribe line.

The III-nitride semiconductor laser device according to the present invention can be configured as follows: the laser structure has a pair of side faces for the III-nitride semiconductor laser device; the recess is located at the one end in the pair of side faces; the support base of the laser structure has a second recess located apart from the aforementioned recess; the second recess extends from the back surface of the support base; the second recess is provided at a portion of the edge of the first surface in one of the first and second fractured faces; a dead end of the second recess is located apart from the second surface of the semiconductor region.

In this III-nitride semiconductor laser device, when the recess and the second recess both are provided in the first and second fractured faces, respectively, first and second scribed grooves can be located near the first and second fractured faces, respectively, for the laser stripe in the laser structure. For this reason, these fractured faces can provide the laser stripe with the higher-quality end faces for the cavity mirrors.

In this III-nitride semiconductor laser device, when the recess and the second recess both are provided in the first fractured face, the fractured face for the laser stripe in the laser structure can be guided by two scribed grooves. For this reason, this fractured face can provide the laser stripe with the higher-quality end face for the cavity mirror.

Another aspect of the present invention relates to a method for fabricating a III-nitride semiconductor laser device. This method comprises the steps of: (a) preparing a substrate comprised of a hexagonal III-nitride semiconductor and having a semipolar primary surface; (b) forming a substrate product having a laser structure, an anode electrode and a cathode electrode, the laser structure including a substrate and a semiconductor region formed on the semipolar primary surface; (c) scribing a first surface of the substrate product in part in a direction of the a-axis of the hexagonal III-nitride semiconductor; and (d) carrying out breakup of the substrate product by press against a second surface of the substrate product, to form another substrate product and a laser bar. The first surface is opposite to the second surface; the semiconductor region is located between the second surface and the substrate; the laser bar has first and second end faces, the first and second end faces extending from the first surface to the second surface, and the first and second end faces being made by the breakup; the first and second end faces form a laser cavity of the III-nitride semiconductor laser device; the anode electrode and the cathode electrode are formed on the laser structure; the semiconductor region comprises a first cladding layer comprised of a first conductivity type GaN-based semiconductor, a second cladding layer comprised of a second conductivity type GaN-based semiconductor, and an active layer provided between the first cladding layer and the second cladding layer; the first cladding layer, the second cladding layer, and the active layer are arranged along a axis normal to the semipolar primary surface; the active layer comprises a GaN-based semiconductor layer; a c-axis of the hexagonal III-nitride semiconductor of the substrate is inclined at a finite angle ALPHA with respect to the normal axis toward an m-axis of the hexagonal III-nitride semiconductor; the angle ALPHA is in one of a range of not less than 45 degrees and not more than 80 degrees and a range of not less than 100 degrees and not more than 135 degrees; and the first and second end faces intersect with an m-n plane defined by the normal axis and the m-axis of the hexagonal III-nitride semiconductor.

According to this method, the first surface of the substrate product is scribed in the direction of the a-axis of the hexagonal III-nitride semiconductor and thereafter the breakup of the substrate product is carried out by press against the second surface of the substrate product, thereby forming the other substrate product and the laser bar. For this reason, the first and second end faces are formed in the laser bar so as to intersect the m-n plane defined by the m-axis of the hexagonal III-nitride semiconductor and the normal axis. This end face forming method provides as the first and second end faces, cavity mirror faces with flatness and perpendicularity enough to construct the laser cavity of the III-nitride semiconductor laser device, or without ion damage.

In this method, when the angle ALPHA is in the range of less than 45 degrees or in the range of more than 135 degrees, the end faces formed by press are highly likely to be composed of m-planes. When the angle is in the range of more than 80 degrees and less than 100 degrees, the desired flatness and perpendicularity are not achieved. The laser waveguide extends in the direction of inclination of the c-axis of the hexagonal III-nitride, and the mirror end faces of the cavity capable of providing this laser waveguide are formed without use of dry-etched facets.

A scribed groove guides generation of the end face in the laser bar, and the bending moment by press for generation of the end face occurs in the semiconductor on the epi-side of the semiconductor laminate including the active layer. This bending moment exhibits a maximum near a face where fracture takes place by the press. The press results in forming the first and second end faces in the laser bar. The large bending moment is suitable for providing the end faces of the active layer, exposed in these end faces, with excellent flatness. After the substrate product is broken up, the scribed groove partly remains as one piece of a scribed mark in the laser bar.

In the method according to the present invention, forming the substrate product comprises the step of performing processing such as slicing or grinding of the substrate so that a thickness of the substrate becomes not more than 400 μm, and the first surface can be a processed surface made by the processing. Alternatively, it can be a surface including an electrode formed on the processed surface.

In the method according to the present invention, forming the substrate product comprises the step of polishing the substrate so that a thickness of the substrate becomes not less than 50 μm and not more than 100 μm, and the first surface can be a polished surface formed by the polishing. Alternatively, it can be a surface including an electrode formed on the polished surface.

When the substrate has such thickness, it is feasible to form the first and second end faces with flatness and perpendicularity enough to construct the laser cavity of the III-nitride semiconductor laser device, or without ion damage, in excellent yield.

In the method according to the present invention, more preferably, the angle ALPHA can be in the range of not less than 63 degrees and not more than 80 degrees or in the range of not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, the desired flatness and perpendicularity are not achieved.

In the method according to the present invention, preferably, the semipolar primary surface is any one of a {20-21} plane, a {10-11} plane, a {20-2-1} plane, and a {10-1-1} plane.

Using these semipolar planes can provide the first and second end faces with flatness and perpendicularity enough to construct the laser cavity of the III-nitride semiconductor laser device, or without ion damage.

In the method according to the present invention, the semipolar primary surface also suitably applicable is a surface with a slight slant toward the m-plane in the range of not less than −4 degrees and not more than +4 degrees from any one semipolar plane of a {20-21} plane, a {10-11} plane, a {20-2-1} plane, and a {10-1-1} plane.

When the primary surface has the slight slant from these typical semipolar planes, it is also feasible to provide the first and second end faces with flatness and perpendicularity enough to construct the laser cavity of the III-nitride semiconductor laser device, or without ion damage.

In the method according to the present invention, the scribing is carried out using a laser scriber, the scribing forms a scribed groove, and a length of the scribed groove is shorter than a length of an intersecting line between the first surface and an a-n plane defined by the a-axis of the hexagonal III-nitride semiconductor and the normal axis.

According to this method, the other substrate product and the laser bar are formed by fracture of the substrate product. This fracture is brought about by using the scribed groove shorter than the fracture line of the laser bar.

In the method according to the present invention, an end face of the active layer in each of the first and second end faces can make an angle with respect to a reference plane perpendicular to the m-axis of the support base of the hexagonal nitride semiconductor, and the angle is in the range of not less than (ALPHA−5) degrees and not more than (ALPHA+5) degrees on a plane defined by the c-axis and the m-axis of the hexagonal III-nitride semiconductor.

This method allows for forming the end faces with the aforementioned perpendicularity, as to the angle taken from one to the other of the c-axis and the m-axis.

In the method according to the present invention, the substrate can be comprised of any one of GaN, AlN, AlGaN, InGaN, and InAlGaN. This method allows the first and second end faces applicable to the cavity to be obtained through the use of the substrate of one of these GaN-based semiconductors.

In the method according to the present invention, scribing the substrate product can comprise the step of forming scribed grooves at a pitch equal to a device width of the III-nitride semiconductor laser device. This method can further comprise a step of performing breakup of the laser bar to produce a III-nitride semiconductor laser device. The laser structure of the III-nitride semiconductor laser device has a pair of side faces for the III-nitride semiconductor laser device. By this method, the laser bar can be produced using the scribed grooves formed at the pitch equal to the device width. The scribed grooves arrayed at the pitch equal to the device width can guide the direction of development of fracture. The scribed grooves can improve the quality of the end faces of the laser stripe located between these scribed grooves.

In the method according to the present invention, scribing the substrate product can comprise the step of forming scribed grooves at a pitch equal to a multiple of a device width of the III-nitride semiconductor laser device. This method can further comprise a step of performing breakup of the laser bar to produce a III-nitride semiconductor laser device. The laser structure of the III-nitride semiconductor laser device has a pair of side faces for the III-nitride semiconductor laser device. By this method, the laser bar can be produced using the scribed grooves formed at the pitch equal to the multiple of the device width.

A III-nitride semiconductor laser device according to an aspect of the present invention comprises: (a) a laser structure including a support base and a semiconductor region, the support base being comprised of a hexagonal III-nitride semiconductor and having a semipolar primary surface, and the semiconductor region being provided on the semipolar primary surface of the support base; and (b) an electrode provided on the semiconductor region of the laser structure. The semiconductor region comprises a cladding layer of a first conductivity type, a cladding layer of a second conductivity type, and an active layer provided between the first cladding layer and the second cladding layer; the cladding layer of the first conductivity type, the cladding layer of the second conductivity type, and the active layer are arranged along an axis normal to the semipolar primary surface; a c-axis of the hexagonal III-nitride semiconductor of the support base being inclined at a finite angle ALPHA with respect to the normal axis toward an m-axis of the hexagonal III-nitride semiconductor, and the angle ALPHA being in one of a range of not less than 45 degrees and not more than 80 degrees and a range of not less than 100 degrees and not more than 135 degrees; the laser structure comprises first and second surfaces, and the first surface being opposite to the second surface; the semiconductor region is located between the second surface and the support base; the support base of the laser structure has pieces of first and second scribed marks, the pieces of the first and second scribed marks being provided at one end and another end of an edge of the first surface in an end portion of the laser structure, respectively; the pieces of the first and second scribed marks extend along a plane defined by the normal axis and an a-axis of the hexagonal III-nitride semiconductor; the pieces of the first and second scribed marks extend from the back surface of the support base; the end of the laser structure has a fractured face that connects edges of the pieces of the first and second scribed marks and the edge of the second surface of the laser structure; and a laser cavity of the III-nitride semiconductor laser device comprises the fractured face.

In this III-nitride semiconductor laser device, because the fractured face intersects with the m-n plane defined by the normal axis and the m-axis of the hexagonal III-nitride semiconductor, it is feasible to provide a laser waveguide extending in a direction of an intersecting line between the m-n plane and the semipolar surface. Therefore, the present invention succeeds in providing the III-nitride semiconductor laser device with the laser cavity enabling a low threshold current. When the angle is in the range of less than 45 degrees or in the range of more than 135 degrees, end faces made by press are highly likely to be made of m-planes. When the angle is in the range of more than 80 degrees and less than 100 degrees, it may result in failing to achieve desired flatness and perpendicularity.

One pieces of each of the first and second scribed marks is provided at the end of the laser structure. These pieces of the first and second scribed marks are arrayed along the a-n plane defined by the normal axis and the a-axis of the hexagonal III-nitride semiconductor. Since the guide of creation of the fractured face for the laser cavity results in the array of the pieces of the first and second scribed marks, the fractured face is provided so as to connect the edges of the pieces of the scribed marks and the edge of the second surface of the laser structure and, as a result, good flatness is provided to the end face of the active layer exposed in the fractured face.

The pieces of the scribed marks extend from the back surface of the support base, and large bending moment occurs during fracture in the semiconductor on the epi-side of the semiconductor laminate including the active layer. The distribution of this moment improves the quality of the fractured face.

Another aspect of the present invention relates to a method for fabricating a III-nitride semiconductor laser device. This method comprises the steps of: (a) forming a substrate product having a laser structure, an anode electrode and a cathode electrode, the laser structure including a substrate comprised of a hexagonal III-nitride semiconductor and a semiconductor region formed on the semipolar primary surface of the substrate; (b) scribing a first surface of the substrate product to form an array of scribed grooves; (c) carrying out breakup of the substrate product by press against a first surface of the substrate product, to form another substrate product and a laser bar. A c-axis of the hexagonal III-nitride semiconductor of the substrate is inclined at a finite angle ALPHA with respect to the normal axis toward an m-axis of the hexagonal III-nitride semiconductor; the angle ALPHA is in one of a range of not less than 45 degrees and not more than 80 degrees and a range of not less than 100 degrees and not more than 135 degrees; the semiconductor region comprises a cladding layer of a first conductivity type, a cladding layer of a second conductivity type, and an active layer provided between the first cladding layer and the second cladding layer; the cladding layer of the first conductivity type, the cladding layer of the second conductivity type, and the active layer are arranged along a axis normal to the semipolar primary surface; the laser bar has first and second end faces, the first and second end faces extending from the first surface to the second surface, and the first and second end faces being made by the breakup; the first surface is opposite to the second surface; the semiconductor region is located between the second surface and the substrate; each of the scribed grooves extend along a plane that is defined by the normal axis and an a-axis of the hexagonal III-nitride semiconductor; the laser bar has first and second end faces made by the breakup; and the first and second end faces form a laser cavity of the III-nitride semiconductor laser device.

According to this method, the first surface of the substrate product is scribed in the direction of the a-axis of the hexagonal III-nitride semiconductor, and thereafter the breakup of the substrate product is carried out by press against the second surface of the substrate product, thereby forming the other substrate product and the laser bar. For this reason, the first and second end faces are formed in the laser bar so as to intersect with the m-n plane defined by the normal axis and the m-axis of the hexagonal III-nitride semiconductor. This method if forming end faces provides cavity mirrors at the first and second end faces with flatness and perpendicularity enough to construct the laser cavity of the III-nitride semiconductor laser device, or without ion damage.

In this method, when the angle ALPHA is in the range of less than 45 degrees or in the range of more than 135 degrees, the end faces formed by press are highly likely to be composed of m-planes. When the angle is in the range of more than 80 degrees and less than 100 degrees, the desired flatness and perpendicularity are not achieved. The laser waveguide extends in the direction of inclination of the c-axis of the hexagonal III-nitride, and the mirror end faces of the cavity capable of providing this laser waveguide are formed without use of dry-etched facets.

The scribed grooves are formed along the a-n plane in the depth and length directions. The array of scribed grooves guide generation of the end face in the laser bar, and the bending moment by press for generation of the end face occurs in the semiconductor on the epi-side of the semiconductor laminate including the active layer. This bending moment shows a maximum near a face where fracture takes place by the press. The pressing results in forming the first and second end faces in the laser bar. The large bending moment is suitable for providing the end faces of the active layer, exposed in these end faces, with excellent flatness. After the substrate product is broken up, the scribed grooves are left as pieces of scribed marks in the laser bar.

BRIEF DESCRIPTION OF THE DRAWINGS

The above object and the other objects, features, and advantages of the present invention can more readily become clear in view of the following detailed description of the preferred embodiments of the present invention proceeding with reference to the accompanying drawings.

FIG. 2 is a drawing showing a band structure in an active layer in the III-nitride semiconductor laser device.

FIG. 7 is a drawing showing a scanning electron microscope image of an end face for optical cavity and showing a piece of a scribed mark in a fractured face.

FIG. 10 is a drawing showing an example of relationship between the pitch of scribed grooves and pieces of scribed marks in a semiconductor laser.

FIG. 11 is a drawing showing another example of relationship between the pitch of scribed grooves and pieces of scribed marks in a semiconductor laser.

FIG. 12 is a drawing showing still another example of relationship between the pitch of scribed grooves and pieces of scribed marks in a semiconductor laser.

FIG. 19 is a drawing showing angles between (20-21) plane and other plane orientations (indices).

DETAILED DESCRIPTION OF THE PREFERRED EMBODIMENTS

The expertise of the present invention can be readily understood in view of the following detailed description with reference to the accompanying drawings provided by way of illustration only.

The following will describe embodiments of the III-nitride semiconductor laser device and the method for fabricating the III-nitride semiconductor laser device according to the present invention, with reference to the accompanying drawings. The same portions will be denoted by the same reference symbols if possible.

Figure 1:
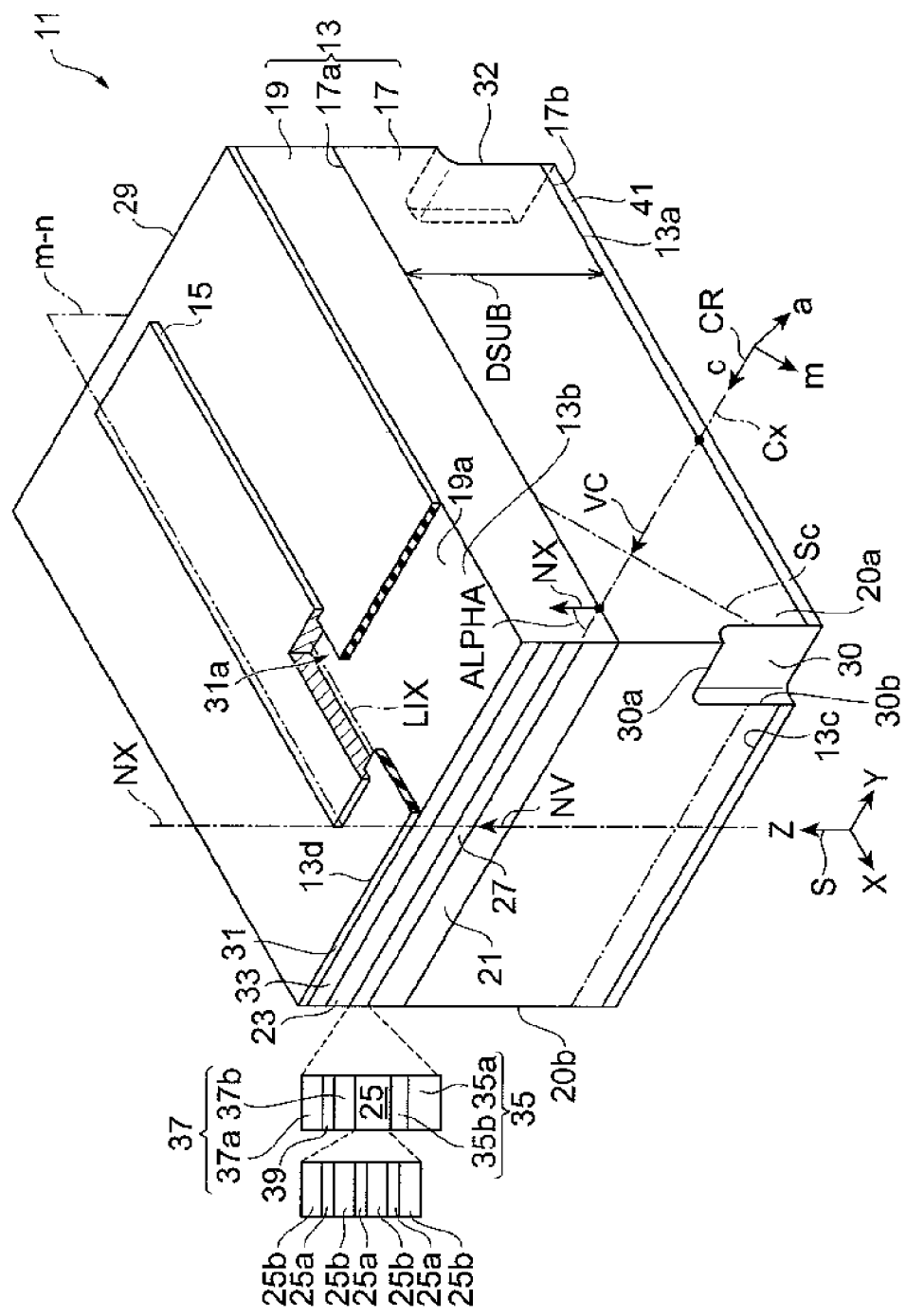
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has a gain-guiding type structure, but embodiments of the present invention are not limited to the gain-guiding type structure. The III-nitride semiconductor laser device 11 has a laser structure 13 and an electrode 15. The laser structure 13 includes a support base 17 and a semiconductor region 19. The support base 17 is comprised of a hexagonal III-nitride semiconductor, and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 is comprised of a first conductivity type GaN-based semiconductor, e.g., n-type AlGaN, n-type InAlGaN, or the like. The second cladding layer 23 is comprised of a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layers and the GaN-based semiconductor layers are, for example, well layers 25a. The active layer 25 includes barrier layers 25b comprised of a GaN-based semiconductor, and the well layers 25a and the barrier layers 25b are alternately arranged. The well layers 25a are comprised, for example, of InGaN or the like, and the barrier layers 25b are comprised, for example, of GaN, InGaN, or the like. The active layer 25 can include a quantum well structure provided so as to generate light at the wavelength of not less than 360 nm and not more than 600 nm. Use of a semipolar plane is suitable for generation of light at the wavelength of not less than 430 nm and not more than 550 nm. The first cladding layer 21, the second cladding layer 23, and the active layer 25 are arranged along a axis NX normal to the semipolar primary surface 17a. In the III-nitride semiconductor laser device 11, the laser structure 13 includes a first fractured face 27 and a second fractured face 29 that intersect with an m-n plane defined by the m-axis of the hexagonal III-nitride semiconductor and the normal axis NX.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X-axis and the Y-axis of the orthogonal coordinate system S. In FIG. 1, a typical c-plane Sc is also depicted. The c-axis of the hexagonal III-nitride semiconductor of the support base 17 is inclined at a finite angle ALPHA with respect to the normal axis NX toward the m-axis of the hexagonal III-nitride semiconductor.

The III-nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 comprises a hexagonal III-nitride semiconductor. The insulating film 31 has an aperture 31a, and this aperture 31a extends in a direction of an intersecting line LIX between the surface 19a of the semiconductor region 19 and the foregoing m-n plane, and is, for example, a stripe shape. The electrode 15 is in contact with the surface 19a of the semiconductor region 19 (e.g., a contact layer 33 of the second conductivity type) through the aperture 31a, and extends in the direction of the foregoing intersecting line LIX. In the III-nitride semiconductor laser device 11, a laser waveguide includes the first cladding layer 21, the second cladding layer 23 and the active layer 25, and extends in the direction of the foregoing intersecting line LIX.

In the III-nitride semiconductor laser device 11, the first fractured face 27 and the second fractured face 29 intersect with the m-n plane defined by the normal axis NX and the m-axis of the hexagonal III-nitride semiconductor. The III-nitride semiconductor laser device 11 has a laser cavity, which is constituted by the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The semiconductor region 10 is provided between the second surface 13b and the support base 17. The first and second fractured faces 27 and 29 each extend from an edge 13c of the first surface 13a to an edge 13d of the second surface 13b. The first and second fractured faces 27 and 29 are different from the conventional cleaved facets such as c-planes, m-planes, or a-planes.

In this III-nitride semiconductor laser device 11, the first and second fractured faces 27 and 29 that form the laser cavity intersect with the m-n plane. This allows for provision of the laser waveguide that extends in the direction of the intersecting line between the m-n plane and the semipolar plane 17a. For this reason, the III-nitride semiconductor laser device 11 has the laser cavity enabling a low threshold current.

The support base 17 of the laser structure 13 has a recess provided in one fractured face (e.g., the first fractured face 27). FIG. 1 shows the recess 30 of an exemplary shape. The recess 30 extends from the back surface 17b of the support base 17. The recess 30 is provided at a portion of the edge 13c of the first surface 13a. A dead end 30a of the recess 30 is located apart from the edge 13d of the second surface 13b. The recess 30 corresponds to a scribed groove before fracture and, therefore, is a piece of scribed mark.

Since the back surface of the support base is provided with a piece of the scribed mark in this manner, the scribed groove is provided in the back surface of the substrate. It becomes feasible to bring about a break by press with a blade on the top side, opposite to the back side of the substrate, of the thin films. The end face for the optical cavity provided in this way has excellent flatness and perpendicularity for use as a fractured face. Such a cavity mirror can provide the semiconductor laser on the semipolar plane with high lasing yield.

Since the recess 30 is associated with the scribed groove, the scribed groove is useful for guiding a developing direction of fracture, in order to provide the laser structure 13 with the fractured face for the cavity. The scribed groove is formed in the back surface of the substrate (support base 17) and the press is implemented on the second surface 13b of the laser structure 13. The fracture propagates in the direction from the first surface 13a to the second surface 13b with the scribed groove as an origin, and also develops in a direction intersecting with the foregoing direction. The bending moment by a press force for the fracture varies in the top layer of the second surface (epitaxial surface) 13b, and upon application of the press force for the fracture, this bending moment is considered to take a maximum value on a plane or line defined by a direction in which the scribed grooves are arrayed. The large bending moment is considered to be one of useful factors for forming an excellent mirror for an optical cavity.

Furthermore, the recess 30 extends along the a-n plane defined by the normal axis NX and the a-axis of the hexagonal III-nitride semiconductor. For this reason, better flatness is provided to the end face of the active layer exposed in the fractured face 27. The recess 30 extends from the back surface 17b of the support base 17, and the end 30a of the recess 30 is located apart from the edge 13d of the second surface (epi-surface) 13b.

A side edge 30b of the recess 30 extends along a side face 20a of the III-nitride semiconductor laser device 11. This side edge 30b is located apart from a reference plane, which is defined in the direction of the normal axis NX and passes the aperture 31a of the insulating film 31 and the light emitting region of the active layer 25.

The edge 13d of the second surface 13b extends from one end at one (e.g., side face 20a) of a pair of side faces (20a, 20b) of the laser structure 13 to the other end at the other thereof (e.g., side face 20b). There is no piece of scribed mark in the edge of the epitaxial surface. The edge 13c extends from one end at one (e.g., side face 20a) of the pair of side faces (20a, 20b) to the side edge 30b. The recess 30 extends from the side face 20b along the a-n plane. The recess 30 is located at one end in the side face 20a.

In the present embodiment, the support base 17 of the laser structure 13 can have a recess 32 provided in the other fractured face (e.g., second fractured face 29) and corresponding to a scribed groove. The recess 32 extends, for example, along the side face 20a of the III-nitride semiconductor laser device 11. The recess 32 also includes a piece of a scribed mark as the recess 30 does. The recess 32 can also have, for example, the same shape as the recess 30. The recess 32 also extends along the a-n plane as the recess 30 does.

The scribed grooves are useful for guiding the developing direction of fracture. For example, when the thickness of the support base 17 is smaller than the depth of the scribed grooves, the recesses 30 and 32 reach the semiconductor region 19.

The III-nitride semiconductor laser device 11 includes an n-side light guide layer 35 and a p-side light guide layer 37. The n-side light guide layer 35 includes a first portion 35a and a second portion 35b, and the n-side light guide layer 35 is comprised, for example, of GaN, InGaN, or the like. The p-side light guide layer 37 includes a first portion 37a and a second portion 37b, and the p-side light guide layer 37 is comprised, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 3:
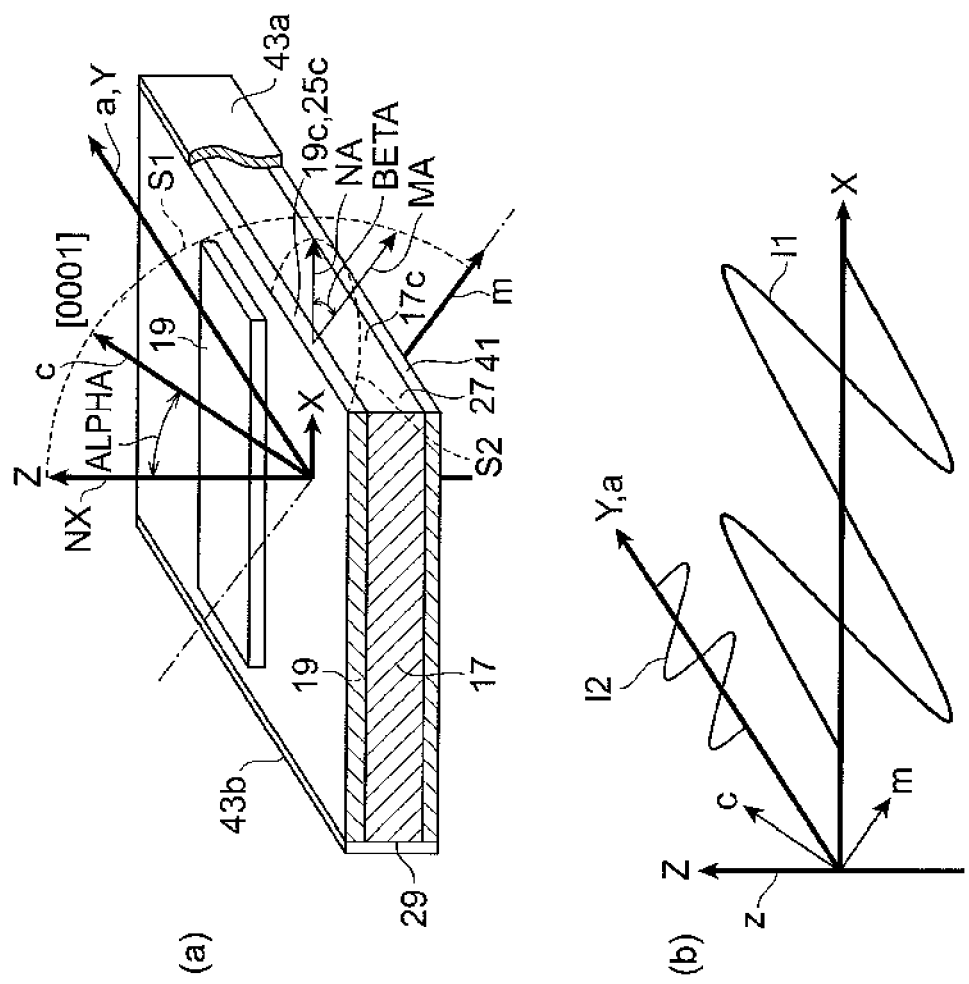
FIG. 3 is a drawing showing polarization of emission in the active layer of the III-nitride semiconductor laser device.
Figure 4:
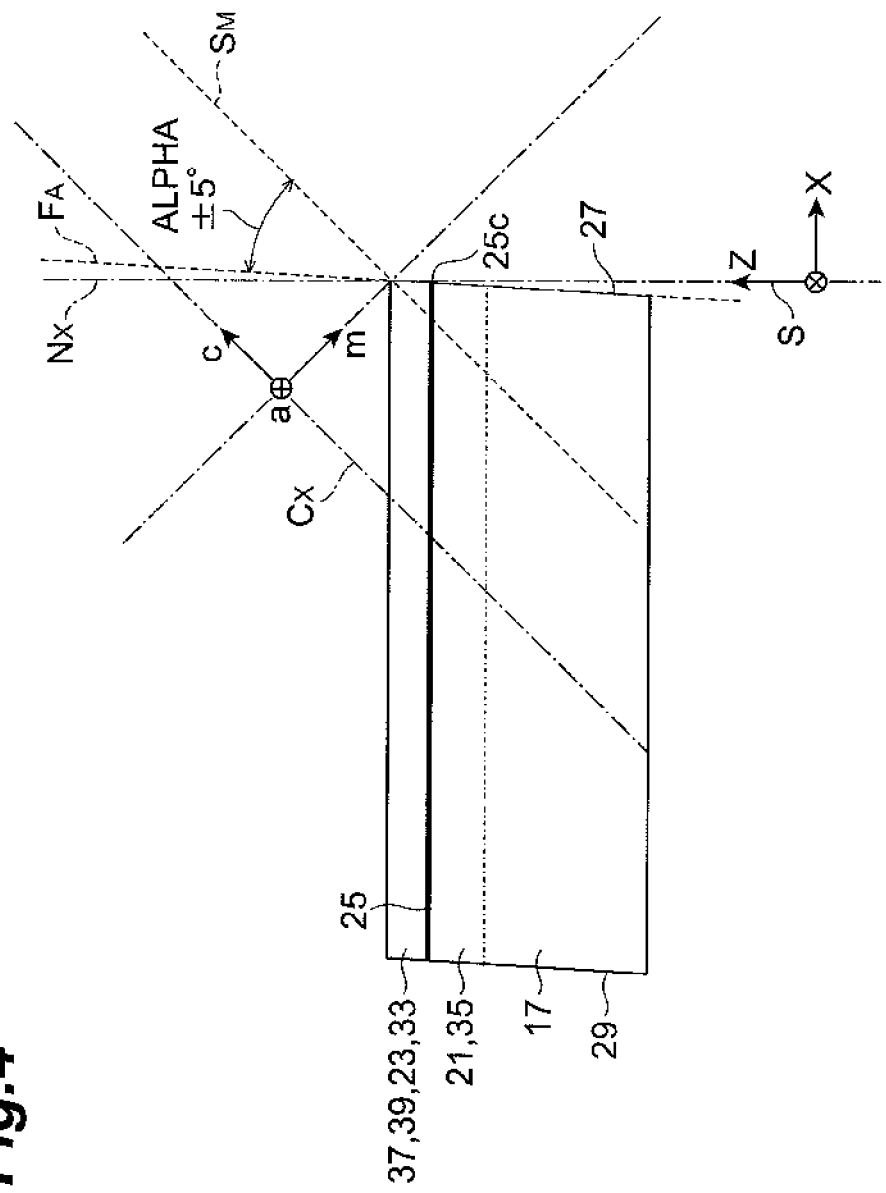
FIG. 4 is a drawing showing a relation between an end face of the III-nitride semiconductor laser device and an m-plane of the active layer.

FIG. 2 is a drawing showing a band structure in the active layer in the III-nitride semiconductor laser device. FIG. 3 is a drawing showing polarization of emission in the active layer 25 of the III-nitride semiconductor laser device 11. FIG. 4 is a drawing schematically showing a cross section defined by the c-axis and the m-axis. With reference to part (a) of FIG. 2, there are three possible transitions between the conduction band and valence bands in the vicinity of Γ point of the band structure BAND. There is a relatively small energy difference between band A and band B. An emission by transition Ea between the conduction band and band A is polarized in the a-axis direction and an emission by transition Eb between the conduction band and band B is polarized in the direction of the c-axis projected onto the primary surface. Concerning lasing, a threshold of transition Ea is smaller than a threshold of transition Eb.

With reference to part (b) of FIG. 2, there are shown spectra of light in the LED mode in the III-nitride semiconductor laser device 11. The light in the LED mode has a polarization component I1 in the direction of the a-axis of the hexagonal III-nitride semiconductor, and a polarization component I2 in the projected direction of the c-axis of the hexagonal III-nitride semiconductor onto the primary surface, and the polarization component I1 is larger than the polarization component I2. Degree of polarization ρ is defined by (I1−I2)/(I1+I2). Using the laser cavity of the III-nitride semiconductor laser device 11, the device can emit lasing light in a mode with large emission intensity in the LED mode.

As shown in FIG. 3, the device may be further provided with dielectric multilayer films 43a and 43b on at least one of the first and second fractured faces 27 and 29 or with both on the respective faces. An end face coat is also applicable to the fractured faces 27 and 29. The end face coat allows adjustment of reflectance.

As shown in part (b) of FIG. 3, the laser light L from the active layer 25 is polarized in the direction of the a-axis of the hexagonal III-nitride semiconductor. In this III-nitride semiconductor laser device 11, a band transition allowing for implementation of a low threshold current has polarized nature. The first and second fractured faces 27, 29 for the laser cavity are different from the conventional cleaved facets such as c-planes, m-planes, or a-planes. However, the first and second fractured faces 27 and 29 have flatness and perpendicularity enough as mirrors for the cavity. For this reason, by using the first and second fractured faces 27 and 29 and the laser waveguide extending between these fractured faces 27 and 29, as shown in part (b) of FIG. 3, it becomes feasible to achieve low-threshold lasing through the use of the emission by transition Ea stronger than the emission by transition Eb polarized in the direction by indicating projection of the c-axis onto the primary surface.

In the III-nitride semiconductor laser device 11, an end face 17c of the support base 17 and an end face 19c of the semiconductor region 19 are exposed in each of the first and second fractured faces 27 and 29, and the end face 17c and the end face 19c are covered by the dielectric multilayer film 43a. An angle BETA between a normal vector NA to the end face 17c of the support base 17 and an end face 25c in the active layer 25, and an m-axis vector MA of the active layer 25 is defined by component $(BETA)_1$ and component $(BETA)_2$, and the component $(BETA)_1$ is defined on a first plane 51 defined by the c-axis and m-axis of the III-nitride semiconductor, and the component $(BETA)_2$ is defined on a second plane S2 (which is not shown but is referred to as "S2" for easier understanding) perpendicular to the first plane 51 (which is not shown but is referred to as "S1" for easier understanding) and the normal axis NX. The component $(BETA)_1$ is preferably in the range of not less than (ALPHA−5) degrees and not more than (ALPHA+5) degrees on the first plane 51 defined by the c-axis and m-axis of the III-nitride semiconductor. This angle range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This III-nitride semiconductor laser device 11 has the end faces in which the aforementioned perpendicularity is satisfied as to the angle BETA taken from one to the other of the c-axis and the m-axis. The component $(BETA)_2$ is preferably in the range of not less than −5 degrees and not more than +5 degrees on the second plane S2. Here, $BETA^2 = (BETA)_1^2 + (BETA)_2^2$. In this case, the end faces 27 and 29 of the III-nitride semiconductor laser device 11 satisfy the aforementioned perpendicularity as to the angle defined on the plane perpendicular to the axis NX normal to the semipolar plane 17a.

Referring again to FIG. 1, in the III-nitride semiconductor laser device 11, the thickness DSUB of the support base 17 is preferably not more than 400 μm. This III-nitride semiconductor laser device is suitable for obtaining good-quality fractured faces for the laser cavity. In the III-nitride semiconductor laser device 11, the thickness DSUB of the support base 17 is more preferably not less than 50 μm and not more than 100 μm. This III-nitride semiconductor laser device 11 is more suitable for obtaining good-quality fractured faces for the laser cavity. Furthermore, the handling becomes easier and the production yield becomes higher.

In the III-nitride semiconductor laser device 11, the angle ALPHA between the normal axis NX and the c-axis of the hexagonal III-nitride semiconductor is preferably not less than 45 degrees and preferably not more than 80 degrees. Furthermore, the angle ALPHA is preferably not less than 100 degrees and preferably not more than 135 degrees. When the angle is in the range of less than 45 degrees or in the range of more than 135 degrees, the end faces made by press are highly likely to be comprised of m-planes. When the angle is in the range of more than 80 degrees and less than 100 degrees, it could result in failing to achieve the desired flatness and perpendicularity.

In the III-nitride semiconductor laser device 11, more preferably, the angle ALPHA between the normal axis NX and the c-axis of the hexagonal III-nitride semiconductor is not less than 63 degrees and not more than 80 degrees. Furthermore, the angle ALPHA is more preferably not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, it could result in failing to achieve the desired flatness and perpendicularity.

The semipolar primary surface 17a can be any one of a {20-21} plane, a {10-11} plane, a {20-2-1} plane, and a {10-1-1} plane. Furthermore, a surface with a slight slant in the range of not less than −4 degrees and not more than +4 degrees with respect to these planes is also suitable for the primary surface. On the semipolar surface 17a of one of these typical planes, it is feasible to provide the first and second end faces 27 and 29 with flatness and perpendicularity enough to construct the laser cavity of the III-nitride semiconductor laser device 11. Furthermore, the end faces with sufficient flatness and perpendicularity are obtained in an angular range across these typical plane orientations.

In the III-nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The support base 17 can be comprised of any one of GaN, AlN, AlGaN, InGaN and InAlGaN. When the substrate comprised of any one of these GaN-based semiconductors is used, the end faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease the lattice mismatch rate between the substrate and the light emitting layer and to improve crystal quality.

Figure 5:
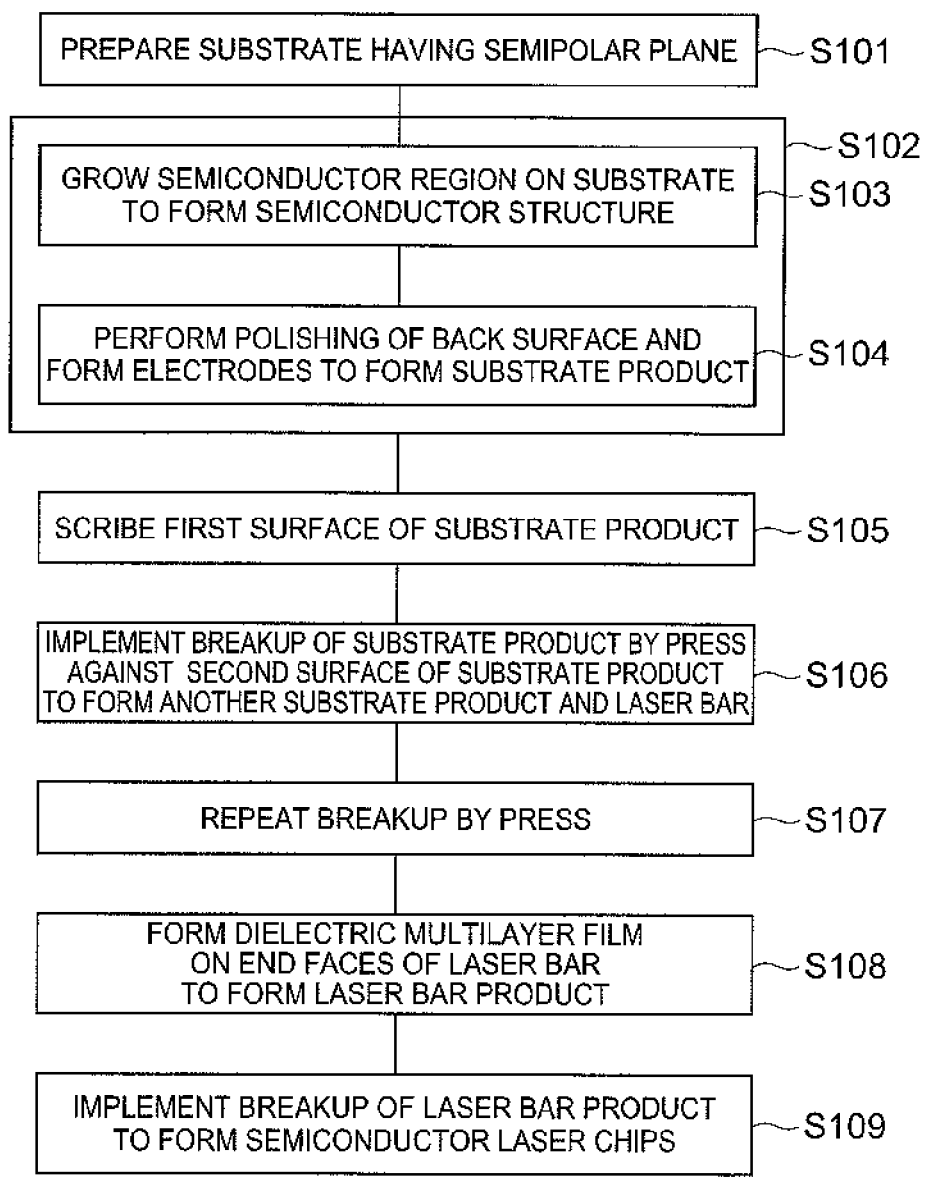
FIG. 5 is a step flowchart showing major steps in a method for fabricating a III-nitride semiconductor laser device according to an embodiment of the present invention.

FIG. 5 is a drawing showing major steps in a method of fabricating a III-nitride semiconductor laser device according to an embodiment of the present invention. With reference to part (a) of FIG. 6, a substrate 51 is shown. In Step S101, the substrate 51 is prepared for fabrication of the III-nitride semiconductor laser device. The c-axis (vector VC) of the hexagonal III-nitride semiconductor of the substrate 51 is inclined at the angle ALPHA with respect to the normal axis NX toward the m-axis (vector VM) of the hexagonal III-nitride semiconductor. For this reason, the substrate 51 has a semipolar primary surface 51a comprised of the hexagonal III-nitride semiconductor.

In Step S102, a substrate product SP is formed. In part (a) of FIG. 6, the substrate product SP is depicted as a member of a nearly disk like shape, but the shape of the substrate product SP is not limited to this. For obtaining the substrate product SP, in step S103, first, the formation of a laser structure 55 is formed. The laser structure 55 includes a semiconductor region 53 and the substrate 51, and in step S103, the semiconductor region 53 is formed on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, light guide layers, an electron block layer, and so on. The GaN-based semiconductor region 57, the light emitting layer 59, and the second conductivity type GaN-based semiconductor region 61 are arranged along the normal axis NX to the semipolar primary surface 51a. These semiconductor layers are epitaxially grown thereon. The surface of the semiconductor region 53 is covered by an insulating film 54. The insulating film 54 is comprised, for example, of silicon oxide. The insulating film 54 has an aperture 54a. The aperture 54a is, for example, a stripe shape.

In Step S104, an anode electrode 58a and a cathode electrode 58b are formed on the laser structure 55. Before forming the electrode on the back surface of the substrate 51, the back surface of the substrate used in crystal growth is polished to form a substrate product SP in a desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. These steps result in forming the substrate product SP. The substrate product SP includes a first surface 63a, and a second surface 63b located opposite thereto. The semiconductor region 53 is located between the second surface 63a and the substrate 51.

Figure 6:
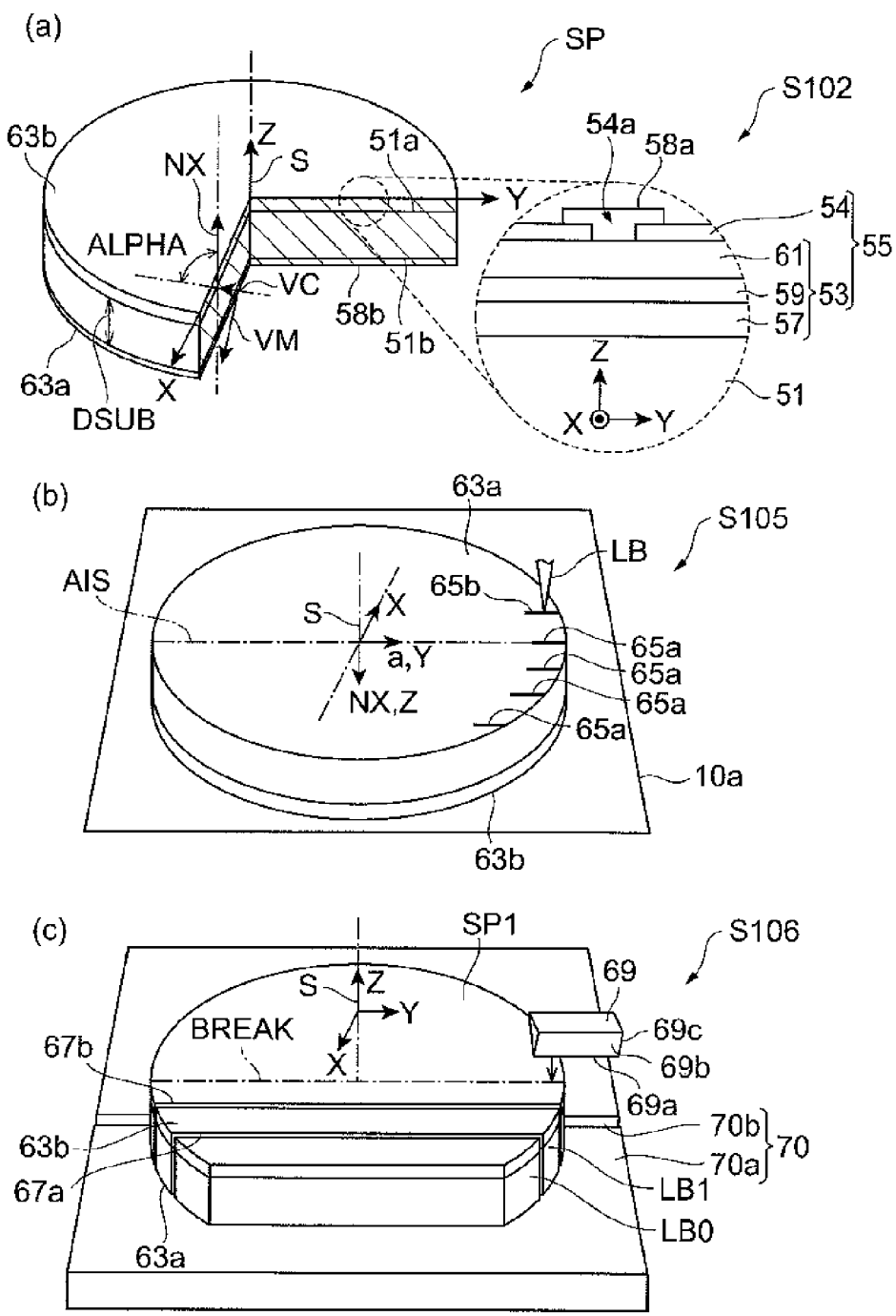
FIG. 6 is a drawing schematically showing major steps in the method for fabricating the III-nitride semiconductor laser device according to the embodiment.

In Step S105, as shown in part (b) of FIG. 6, the first surface 63a of the substrate product SP is scribed. This scribing step is carried out with a laser scriber 10a. This step S105 results in forming scribed grooves 65a. In part (b) of FIG. 6, five scribed grooves are already formed and formation of a scribed groove 65b is in progress with a laser beam LB. The length of the scribed grooves 65a is shorter than the length of an intersecting line MS defined by the normal axis NX and the a-n plane that is defined by the first surface 63a and the a-axis of the hexagonal III-nitride semiconductor, and the laser beam LB is applied to a part of the intersecting line MS. By the application with the laser beam LB, grooves extending in the specific direction and reaching the semiconductor region are formed in the first surface 63a. The scribed grooves 65a can be formed, for example, at an edge of the substrate product SP. It is also possible to form plural scribed grooves arrayed along the intersecting line MS. For forming each individual scribed groove, step S105 is preferably carried out to adjust the axis of the laser beam LB relative to the first surface 63a so as to make the laser beam LB virtually normally incident to the first surface 63a. The range of axial deviation of the laser beam LB can be, for example, not less than −5 degrees and not more than +5 degrees with respect to the line normal to the first surface 63a.

The scribed groove 65a is useful for guiding the developing direction of fracture. The scribed groove 65a has the depth (value in the Z-axis direction), width (value in the X-axis direction), and length (value in the Y-axis direction), and extends along an a-n plane as to the depth and length directions thereof. For providing the laser structure 55 with the fractured faces for the cavity, the scribed groove 65a is useful for guiding the developing direction of fracture and is formed in the back surface 51a of the substrate (support base 17) 51, and the press is implemented on the second surface 63b of the laser structure 55. The fracture develops in the direction from the first surface 63a to the second surface 63b with the scribed groove 65a as an origin, and also develops in a direction intersecting with it.

There is a distribution of bending moment by press force for fracture in the top layer of the second surface (epi-surface) 63b, and this bending moment distribution is considered to become maximum on a plane or line defining the direction of arrangement of scribed grooves 65a. It is thus preferable to apply the press force for fracture in alignment with this plane or line. The large bending moment is considered to be one of useful factors for formation of excellent cavity mirrors.

In Step S106, as shown in part (c) of FIG. 6, breakup of the substrate product SP is implemented by press against the second surface 63b of the substrate product SP to form a substrate product SP1 and a laser bar LB1. The press is carried out with a breaking device, for example, like a blade 69. The blade 69 includes an edge 69a extending in one direction, and at least two blade faces 69b and 69c that defines the edge 69a. The press onto the substrate product SP1 is carried out on a support device 70. The support device 70 includes a support table 70a and a recess 70b, and the recess 70b extends in one direction. The recess 70b is formed in the support table 70a. The orientation and position of the scribed groove 65a of the substrate product SP1 are aligned with the extending direction of the recess 70b of the support device 70 to position the substrate product SP1 to the recess 70b on the support device 70. The orientation of the edge of the breaking device is aligned with the extending direction of the recess 70b, and the edge of the breaking device is pressed against the substrate product SP1 from a direction intersecting with the second surface 63b. The intersecting direction is preferably an approximately normal direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to the cavity mirrors of the semiconductor laser.

The array of scribed grooves are formed in the back surface 51b of the substrate 51 so as to guide the developing direction of fracture, and the press is implemented on the second surface 63b of the laser structure 55. The fracture propagates in the direction from the first surface 63a to the second surface 63b (e.g., the Z-axis direction) from each scribed groove that works as an origin, and also propagates in a direction intersecting with it (e.g., the Y-axis direction).

In the step of scribing the substrate product SP1, a number of scribed grooves can be formed at the pitch equal to the device width of the III-nitride semiconductor laser device. Since the scribed grooves are formed at the pitch of the device width, the guidance of fracture is implemented for each device width in development of fracture in the Y-axis direction. For this reason, we can expect secure guidance in the generating direction of fracture. The scribed grooves that are arrayed at the pitch equal to the device width can guide the developing direction of fracture. The arrayed grooves ensure excellent quality for the end face of the laser stripe that is located between the scribed grooves.

As another applicable example, the step of scribing the substrate product SP1 can be configured to form the scribed grooves at the pitch equal to a multiple of the device width of the III-nitride semiconductor laser device. For example, when the scribed grooves are formed at the pitch equal to double the device width, the guidance of fracture can be implemented in development of fracture in the Y-axis direction. For this reason, good guidance can be expected in the development of fracture. The scribed grooves arrayed at the pitch equal to double the device width can guide the developing direction of fracture. The arrayed grooves ensure excellent quality for the end faces of the laser stripe that is located between the scribed grooves.

When the scribed grooves and their array are formed in the back surface of the substrate and extend along the plane defined by the a-axis and the normal axis, and the substrate product is broken up by the press applied to the top of thin films with the blade, it is feasible to produce the mirrors for the optical cavity with excellent flatness and perpendicularity and to improve the lasing yield of semiconductor lasers formed on the semipolar plane.

The laser bar LB1 thus formed has the first and second end faces 67a and 67b formed by the aforementioned breakup and each of the end faces 67a and 67b extends from the first surface 63a to the second surface 63b. For this reason, the end faces 67a and 67b form the laser cavity of the III-nitride semiconductor laser device, and intersect with the XZ plane. This XZ plane corresponds to the m-n plane defined by the normal axis NX and the m-axis of the hexagonal III-nitride semiconductor.

According to this method, the first surface 63a of the substrate product SP is scribed in the direction of the a-axis of the hexagonal III-nitride semiconductor, and thereafter the breakup of the substrate product SP is carried out by press against the second surface 63b of the substrate product SP, thereby forming the new substrate product SP1 and the laser bar LB1. For this reason, the first and second end faces 67a and 67b are formed in the laser bar LB1 so as to intersect with the m-n plane. This end face forming method provides the first and second end faces 67a and 67b with flatness and perpendicularity enough to construct the laser cavity of the III-nitride semiconductor laser device.

In this method, the laser waveguide formed as above extends in the direction of inclination of the c-axis of the hexagonal III-nitride. The mirror end faces for optical cavity allowing for provision of this laser waveguide are formed without use of dry-etched facets.

This method involves the fracture of the substrate product SP1, thereby forming the new substrate product SP1 and the laser bar LB1. In Step S107, the breakup by press is repeatedly carried out to produce a number of laser bars. This fracture is brought about using the scribed grooves 65a shorter than a fracture line BREAK of the laser bar LB1.

In Step S108, dielectric multilayer films are formed on the end faces 67a and 67b of the laser bar LB1 to form a laser bar product. In Step S109, this laser bar product is broken into chips of individual semiconductor lasers. Each semiconductor laser chip has a pair of side faces for the semiconductor laser formed by this break.

The breakup of the laser bar LB1 or laser bar product is carried out to produce the III-nitride semiconductor laser device. When the scribed grooves are formed at the pitch equal to the device width of the III-nitride semiconductor laser device in the step of scribing the substrate product SP, the positions of the scribed grooves can be aligned with positions at which the laser bar is broken into chips of individual semiconductor lasers. The breakup of the laser bar LB1 or laser bar product is carried out so that the pair of side faces for the semiconductor laser is aligned with the positions of the scribed grooves. This allows the laser stripe to be apart from the pair of side faces for the semiconductor laser, and also allows the positions of the scribed grooves (pieces of scribed marks) to be apart from the laser stripe.

As described previously, the scribed grooves can be formed at the pitch equal to a multiple of the device width of the III-nitride semiconductor laser device in the step of scribing the substrate product SP. For example, when the scribed grooves are formed at the pitch equal to double the device width, the positions of the scribed grooves can be aligned with the positions at which the laser bar is broken into chips of individual semiconductor lasers. The chip breakup of the laser bar LB1 or laser bar product is implemented so that either one of the side faces of the semiconductor laser is aligned with the position of the scribed groove.

In the fabrication method according to the present embodiment, the angle ALPHA can be in the range of not less than 45 degrees and not more than 80 degrees or in the range of not less than 100 degrees and not more than 135 degrees. When the angle is in the range of less than 45 degrees or in the range of more than 135 degrees, the end face made by press becomes highly likely to be comprised of an m-plane. When the angle is in the range of more than 80 degrees and less than 100 degrees, it could result in failing to achieve the desired flatness and perpendicularity. More preferably, the angle ALPHA can be in the range of not less than 63 degrees and not more than 80 degrees or in the range of not less than 100 degrees and not more than 117 degrees. When the angle is in the range of less than 45 degrees or in the range of more than 135 degrees, an m-plane can appear in part of an end face formed by press. When the angle is in the range of more than 80 degrees and less than 100 degrees, it could result in failing to achieve the desired flatness and perpendicularity. The semipolar primary surface 51a can be any one of a {20-21} plane, a {10-11} plane, a {20-2-1} plane, and a {10-1-1} plane. Furthermore, a surface with a slight slant in the range of not less than −4 degrees and not more than +4 degrees from each plane as above is also suitable for the primary surface. On these typical semipolar planes, it is feasible to provide the end faces for the laser cavity with flatness and perpendicularity enough to construct the laser cavity of the III-nitride semiconductor laser device.

The substrate 51 can be comprised of any one of GaN, AlN, AlGaN, InGaN, and InAlGaN. When the substrate used is comprised of any one of these GaN-based semiconductors, it is feasible to obtain the end faces applicable to the laser cavity. The substrate 51 is preferably comprised of GaN.

In the step S104 of forming the substrate product SP, the semiconductor substrate used in crystal growth can be subjected to processing such as slicing or grinding so that the substrate thickness becomes not more than 400 μm, and having the first surface 63b of a processed surface formed by polishing. In this substrate thickness, the end faces 67a and 67b can be formed in good yield with flatness and perpendicularity enough to construct the laser cavity of the III-nitride semiconductor laser device and without ion damage. More preferably, the first surface 63b is a polished surface formed by polishing and the thickness of the polished substrate is not more than 100 μm. In order to ensure easily handling of the substrate product SP, the substrate thickness is preferably not less than 50 μm.

In the production method of the laser end faces according to the present embodiment, the angle BETA explained with reference to FIG. 3 is also defined in the laser bar LB1. In the laser bar LB1, the component (BETA)$_1$ of the angle BETA is preferably in the range of not less than (ALPHA−5) degrees and not more than (ALPHA+5) degrees on the first plane (which corresponds to the first plane 51 in the description with reference to FIG. 3) defined by the c-axis and m-axis of the III-nitride semiconductor. The end faces 67a and 67b of the laser bar LB1 satisfy the aforementioned perpendicularity as to the angle component of the angle BETA taken from one to the other of the c-axis and the m-axis. The component (BETA)$_2$ of the angle BETA is preferably in the range of not less than −5 degrees and not more than +5 degrees on the second plane (which corresponds to the second plane S2 shown in FIG. 3). In this case, the end faces 67a and 67b of the laser bar LB1 satisfy the aforementioned perpendicularity as to the angle component of the angle BETA defined on the plane perpendicular to the normal axis NX to the semipolar plane 51a.

The end faces 67a and 67b are formed by break by press against plural GaN-based semiconductor layers epitaxially grown on the semipolar surface 51a. Since the laminate made of epitaxial films on the semipolar plane 51a, the end faces 67a and 67b are not cleaved facets with a low plane index like c-planes, m-planes, or a-planes, which have been used heretofore for the conventional mirrors for optical cavity. However, through the break of the stack of epitaxial films on the semipolar surface 51a, the end faces 67a and 67b have the flatness and perpendicularity applicable as mirrors for optical cavity.

Example 1

A semipolar-plane GaN substrate is prepared and perpendicularity of a fractured face is observed as described below. A {20-21}-plane GaN substrate is used as the substrate, which is cut at the angle of 75 degrees toward the m-axis out of a (0001) GaN ingot thickly grown by HVPE. The primary surface of the GaN substrate is mirror-finished, and the back surface is in a ground pear-skin state. The thickness of the substrate was 370 μm.

On the back side in the pear-skin state, a marking line is drawn perpendicularly to the direction of the projected c-axis onto the primary surface of the substrate with a diamond pen, and thereafter the substrate is fractured by press. For observing the perpendicularity of the resultant fractured face, the substrate is observed from the a-plane direction with a scanning electron microscope.

Part (a) of FIG. 7 is a scanning electron microscope image of the fractured face observed from the a-plane direction, and the right end face is the fractured face. It is seen that the fractured face has flatness and perpendicularity to the semipolar primary surface. Part (b) of FIG. 7 shows a scanning electron microscope image for observing the surface of the fractured face, and a piece of a scribed mark is formed on the back surface of the substrate. In the drawing "front surface" indicates the epitaxial surface and "back surface" indicates the back surface of the substrate. The thickness of this substrate is 90 μm.

Figure 8:
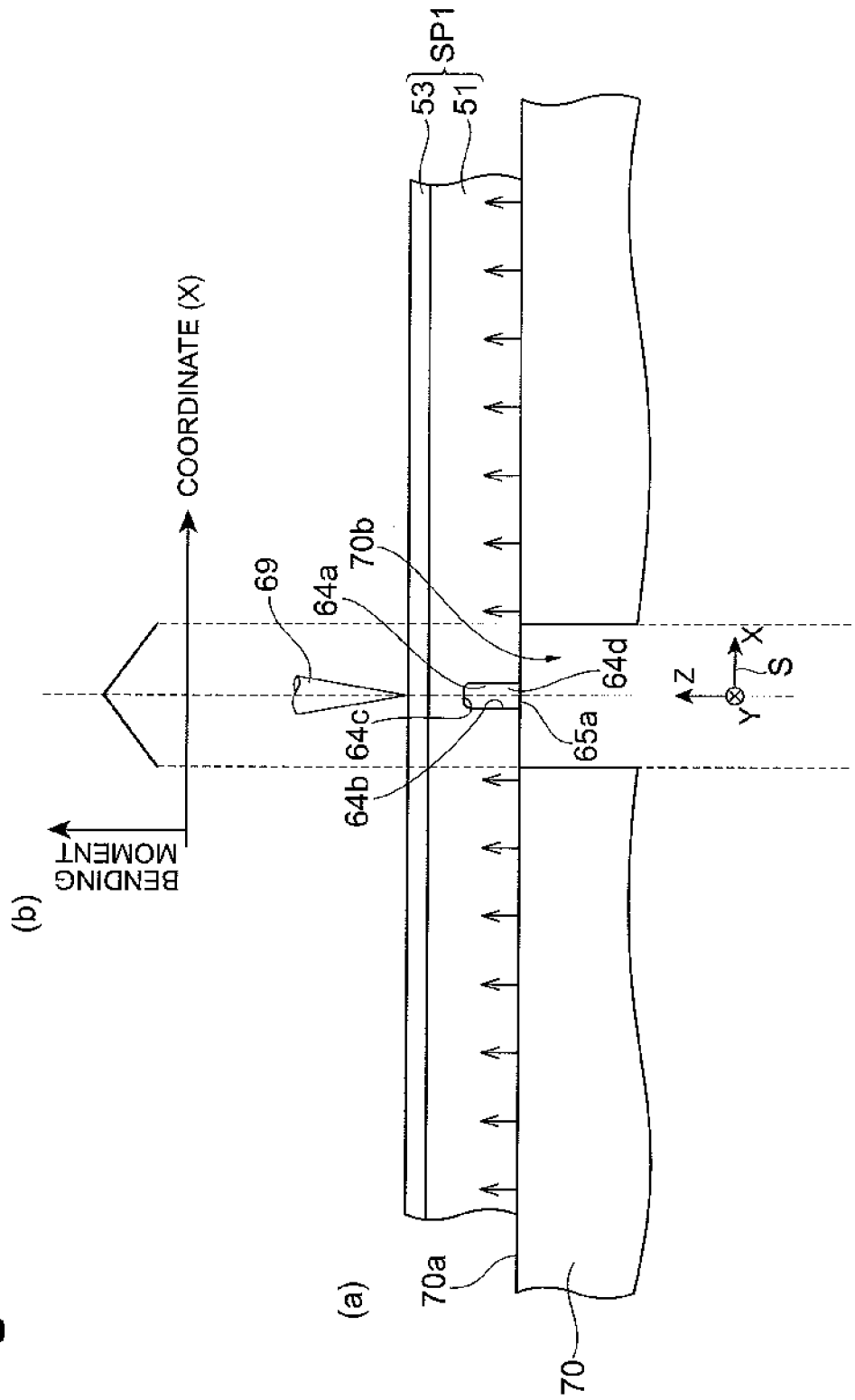
FIG. 8 is a drawing showing a substrate product in contact with a blade on a support device for fracture, and a distribution of bending moment therein.

The below will describe the break in the substrate product SP1 with the scribed grooves in the back surface of the substrate. With reference to part (a) of FIG. 8, the substrate product SP1 is supported on the support table 70a of the support device 70 for fracture. The direction of the array of scribed grooves 65a in the substrate product SP1 is aligned with the orientation of the recess 70b. Each scribed groove 65a has side faces 64a and 64b, a bottom face 64c, and a pair of end faces 64d. When the blade 69 is pressed against the front surface of the substrate product SP1 on the support device 70, the substrate product SP1 becomes curved as shown in part (a) of FIG. 9 with the epitaxial surface being concave. It is therefore considered that in the semiconductor region 53 of the laser structure 55, the bending moment takes a maximum in the top layer of the semiconductor region 53 immediately below the fracture line extending in the direction of the array of scribed grooves 65a, as shown in part (b) of FIG. 8, and that the bending moment decreases with distance from immediately below the fracture line to both sides (in the positive and negative directions of the X-axis). It is preferable to align a direction of contact of the blade 69 with this fracture line. At this time, the bending moment becomes maximum right below the blade and right below the fracture line; therefore, a flat end face is obtained in the semiconductor thin films, as shown in part (b) of FIG. 7, along the line on which the blade is in contact, and the laser bar has the end face with high quality enough for a cavity mirror. The laser bar includes an array of semiconductor laser devices, and the quality of the end face show little variation among the semiconductor laser devices therein; therefore, the quality of the fractured face has a small variation. The semiconductor laser and the fabrication method thereof improve the quality of the cavity mirror.

The following will describe the break in the substrate product with the scribed grooves in the epitaxial surface. This substrate is different from the substrate product SP1. When the substrate product on the support device 70 is pressed with the blade 69, this substrate product becomes curved opposite to the curve of the substrate product SP1, as shown in part (b) of FIG. 9, with the epitaxial surface being convex. The bending moment takes maximum value in the top layer of the back surface of the substrate immediately below the fracture line defined by the direction of the array of scribed grooves 66a.

Figure 9:
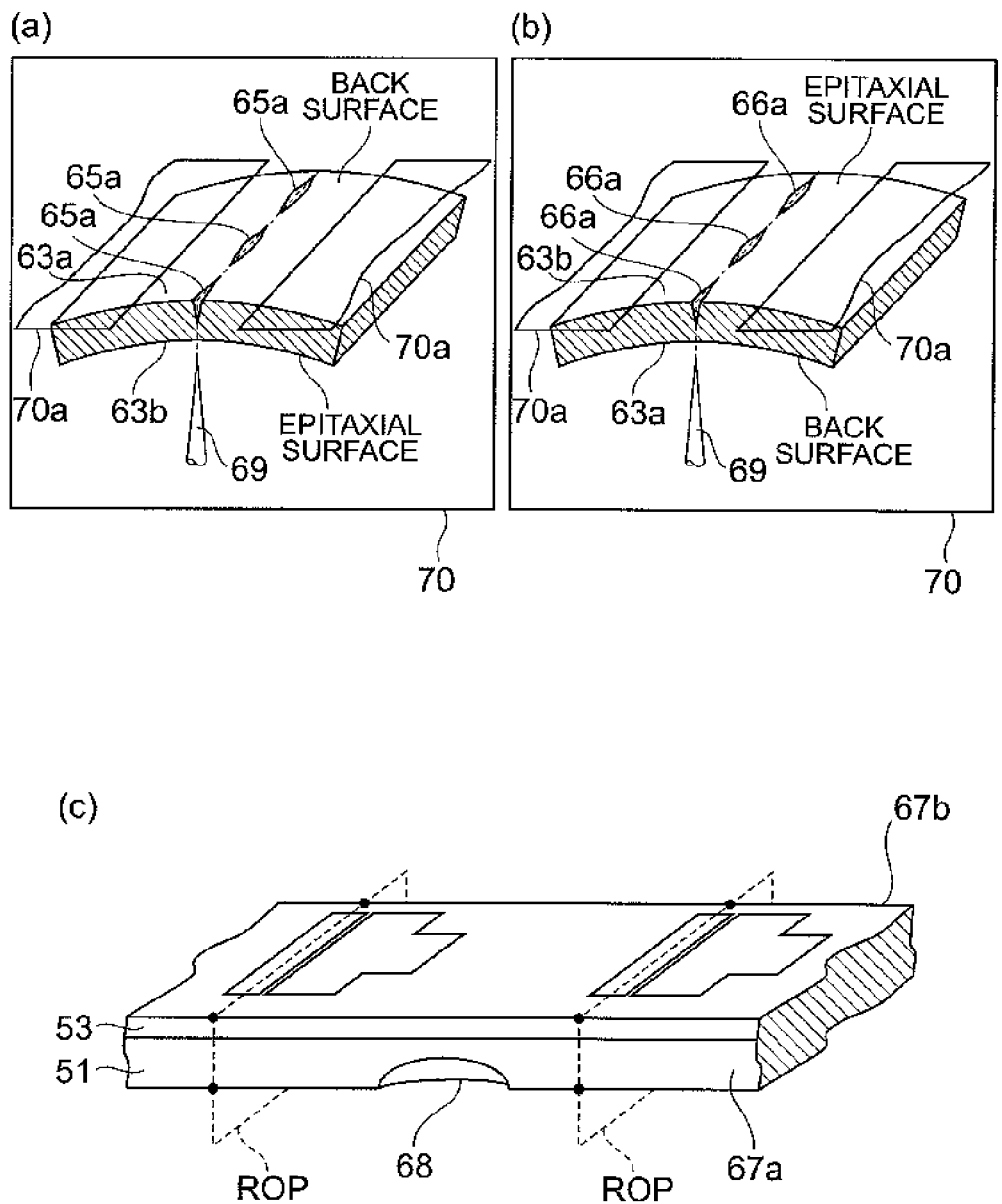
FIG. 9 is a drawing schematically showing substrate products under fracture in the support device.

Part (c) of FIG. 9 shows a laser bar produced by the method shown in part (a) of FIG. 9. This laser bar has a piece of a scribed mark 68 left on the back surface of the substrate. The scribed mark 68 is located between reference planes ROP passing respective emission areas in end faces of two semiconductor lasers.

For producing the laser bar, the array of scribed grooves can be formed at the pitch P1 of the width of semiconductor lasers. In this array, as shown in part (a) of FIG. 10, pieces of the scribed marks SB1 are formed at the pitch P1 of the width of semiconductor lasers in the laser bar LB2. When this laser bar LB2 is broken up to form semiconductor laser devices LD1, each semiconductor laser LD1 has pieces of scribed marks QB1 at four corners of the bottom face of the support base, as shown in part (b) of FIG. 10. At an end of the laser structure, a fractured face CAV1 connects edges EG1 of a pair of pieces of scribed marks QB1 and an edge EG2 of the second surface of the laser structure. The fractured face CAV1 is applicable to the laser cavity and has particularly excellent flatness and perpendicularity.

For producing the laser bar, the array of scribed grooves can be formed at the pitch P2 corresponding to double the width of semiconductor lasers. In this array, as shown in part (a) of FIG. 11, pieces of the scribed marks SB2 are formed at the pitch P2 of double the width of semiconductor lasers in the laser bar LB3. When this laser bar LB3 is broken up to form semiconductor laser devices LD2, each semiconductor laser LD2 has two pieces of scribed marks QB2 in one edge of the bottom face of the support base, as shown in part (b) of FIG. 11. At an end of the laser structure, a fractured face CAV2 connects an edge EG3 of pieces of the scribed mark QB2 and an edge EG2 of the second surface of the laser structure. The fractured face CAV2 is applicable to the laser cavity and has excellent flatness and perpendicularity.

For producing the laser bar, the array of scribed grooves can be formed at the pitch P2 corresponding to double the width of semiconductor lasers. In this array, as shown in part (a) of FIG. 12, pieces of the scribed marks SB3 are formed at the pitch P2 of double the width of semiconductor lasers in the laser bar LB4. When this laser bar LB4 is broken up to form semiconductor laser devices LD3, each semiconductor laser LD3 has a piece of a scribed mark QB3 in one edge of the bottom face of the support base and a piece of the scribed mark QB3 in another edge, as shown in part (b) of FIG. 12. At an end of the laser structure, a fractured face CAV3 connects an edge EG3 of a piece of the scribed mark QB3 and an edge EG2 of the second surface of the laser structure. The fractured face CAV3 is applicable to the laser cavity and has excellent flatness and perpendicularity.

Example 2

Figure 13:
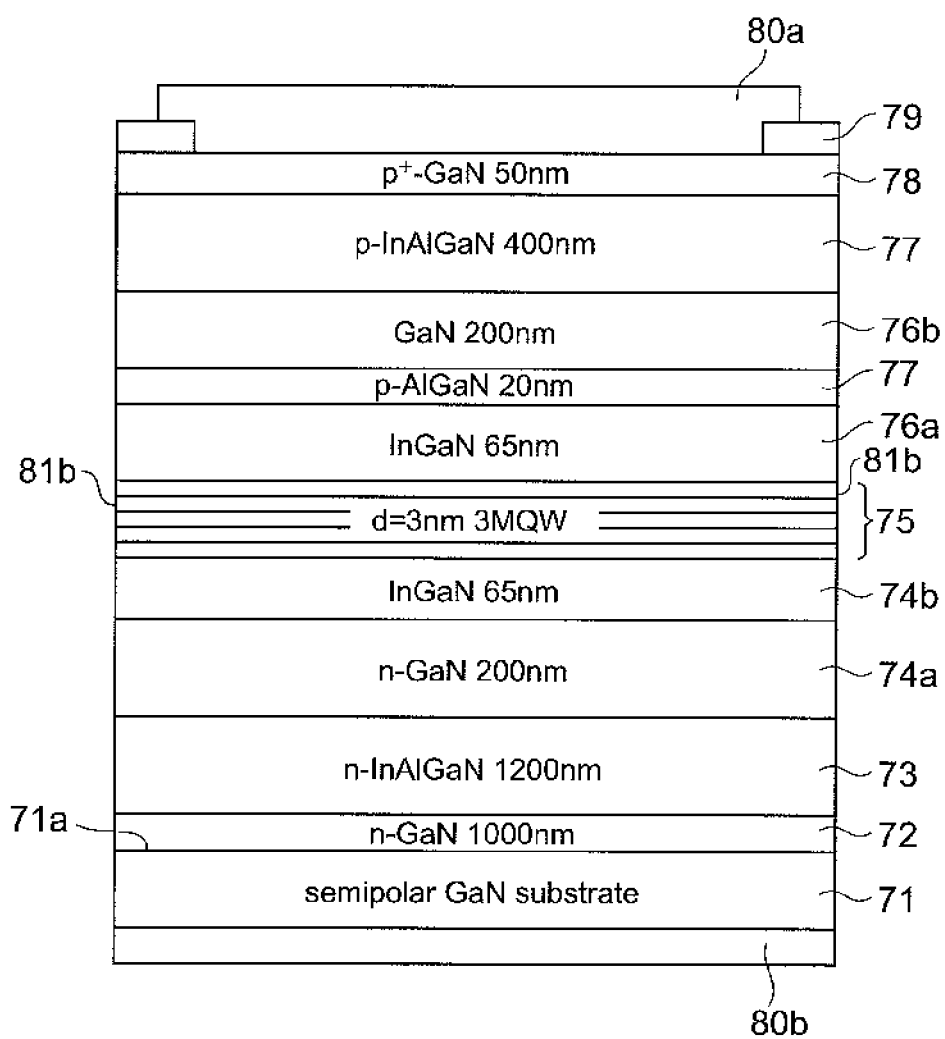
FIG. 13 is a drawing showing a structure of a laser diode shown in Example 1.

Example 1 shows that, in the GaN substrate having the semipolar {20-21} plane, the fractured face is obtained by drawing the marking line perpendicular to the direction of the projected c-axis onto the primary surface of the substrate and pressing the substrate and has the flatness and perpendicularity to the primary surface of the substrate. For checking applicability of this fractured face to the laser cavity, a laser diode shown in FIG. 13 is grown by metal-organic vapor phase epitaxy as described below. The raw materials used are trimethyl gallium (TMGa), trimethyl aluminum (TMAl), trimethyl indium (TMIn), ammonia ($NH_3$), and silane ($SiH_4$). A substrate 71 is prepared. The substrate 71 prepared is a GaN substrate formed by cutting at an angle in the range of zero degrees to 90 degrees toward the m-axis out of a (0001) GaN ingot, thickly grown by HVPE, with a wafer slicing apparatus in such a manner that the angle ALPHA of inclination of the c-axis toward the m-axis has a desired off angle in the range of zero degrees to 90 degrees. For example, when the substrate is cut at the angle of 75 degrees, the resultant substrate is a {20-21}-plane GaN substrate and it is represented by reference symbol 71a in the hexagonal crystal lattice shown in part (a) of FIG. 8.

Before the growth, the substrate is observed by the cathodoluminescence method in order to estimate the stacking fault density of the substrate. The cathodoluminescence is used to observe an emission process of carriers excited by an electron beam and if there is a stacking fault, non-radiative recombination of carriers occurs in the vicinity thereof to create a dark line in the observation. The stacking fault density is defined as a density (line density) per unit length of dark lines. The cathodoluminescence method of nondestructive measurement is applied herein in order to estimate the stacking fault density, but it is also possible to use a transmission electron microscope of destructive measurement. When a cross section of a sample prepared is observed from the a-axis direction with the transmission electron microscope, a defect extending in the m-axis direction from the substrate toward the sample surface indicates a stacking fault included in the support base, and the line density of stacking faults can be determined in the same manner as in the case of the cathodoluminescence method.

This substrate 71 is placed on a susceptor in a reactor, and the epitaxial layers are grown according to the following growth procedure to form a semiconductor region on the n-type GaN substrate 71. First, an n-type GaN layer 72 is grown in the thickness of 1000 nm. Next, an n-type InAlGaN cladding layer 73 is grown in the thickness of 1200 nm. Thereafter, an n-type GaN guide layer 74a and an undoped InGaN guide layer 74b are grown in the thickness of 200 nm and in the thickness of 65 nm, respectively, and then a three-cycle MQW 75 consisting of GaN 15 nm thick/InGaN 3 nm thick is grown. Subsequently grown are an undoped InGaN guide layer 76a in the thickness of 65 nm, a p-type AlGaN block layer 77 in the thickness of 20 nm, and a p-type GaN guide layer 76b in the thickness of 200 nm. Then, a p-type InAlGaN cladding layer 77 is grown in the thickness of 400 nm. Finally, a p-type GaN contact layer 78 is grown in the thickness of 50 nm. A laser structure is formed through these steps.

An insulating film 79 of $SiO_2$ is deposited on the contact layer (epitaxial surface of the laser structure) 78, and then photolithography is used to form a stripe window in the width of 10 μm by wet etching. In this step, two types of contact windows are formed along two stripe directions. They are the laser stripe along (1) M-direction (direction of the contact window extending along the predetermined plane defined by the c-axis and the m-axis), and the laser stripe along (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using a diamond slurry to produce a substrate product with the back surface mirror-polished. At this time, the thickness of the substrate product is measured with a contact film thickness meter. The measurement of thickness may also be carried out from a sample cross section with a microscope. The microscope applicable herein is an optical microscope or a scanning electron microscope. An n-side electrode 80b of Ti/Al/Ti/Au is formed by vapor deposition on the back surface (polished surface) of the GaN substrate (GaN wafer).

The cavity mirrors for these two types of laser stripes are produced with a laser scriber using the YAG laser at the wavelength of 355 nm. When the break is implemented with the laser scriber, the lasing chip yield can be improved as compared with the scribing using the diamond scribing method. The conditions for formation of the scribed grooves are as follows: laser beam output of 100 mW; scanning speed of 5 mm/s The scribed grooves thus formed are, for example, grooves having the length of 30 μm, the width of 10 μm, and the depth of 40 μm. The scribed grooves are formed by applying the laser beam directly to the epitaxially grown surface at the pitch of 800 μm and through the aperture of the insulating film of the substrate. The cavity length is 600 μm.

The end faces for cavity mirrors are made by fracture with a blade. The scribed grooves are formed herein in two ways as described below. The first way is to form the scribed grooves on the thin film side (for method A) and the second way is to form the scribed grooves on the back surface side (for method B). The spacing of the array of scribed grooves is a value for the cavity length, 600 μm. The back surface of the substrate was pressed where the scribed grooves were formed on the front surface side (epitaxial surface side) (method (A)). The epitaxial surface (semiconductor region side) was pressed where the scribed grooves were formed on the back surface side (method (B)). The substrate products are broken up by the press methods to produce respective laser bars.

Figure 14:
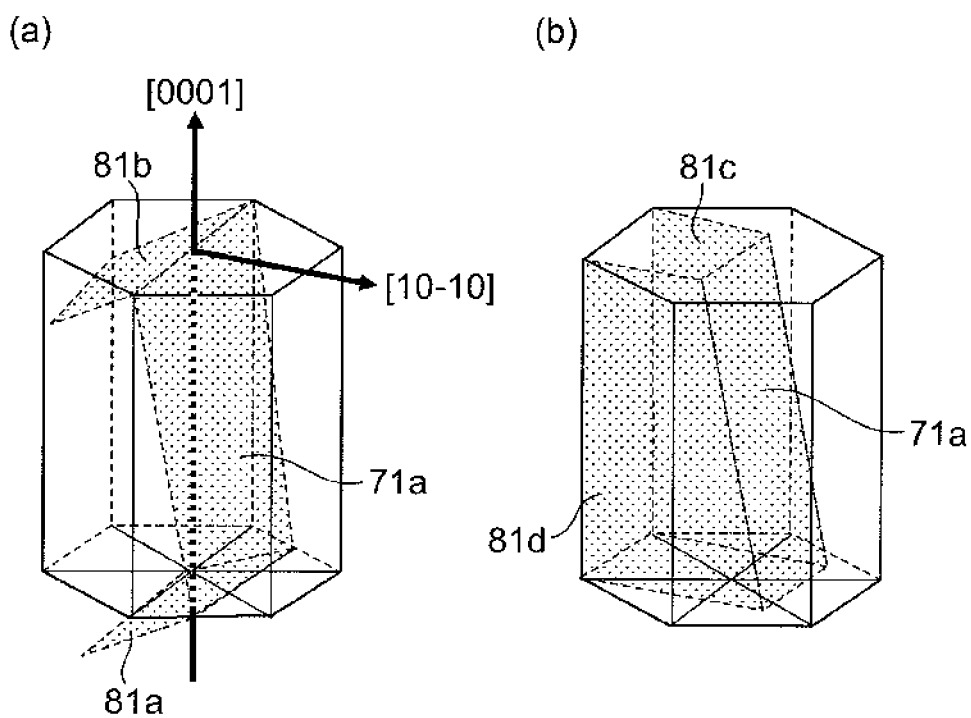
FIG. 14 is a drawing showing a {20-21} plane in crystal lattices and a-plane end faces for a cavity.

More specifically, parts (a) and (b) of FIG. 14 show relations between crystal orientations and fractured faces, for the {20-21}-plane GaN substrate. Part (a) of FIG. 14 shows the case where the laser stripe is provided (1) in the M-direction and shows end faces 81a and 81b for the laser cavity along with the semipolar plane 71a. The end faces 81a and 81b are approximately perpendicular to the semipolar plane 71a, but are different from the conventional cleaved facets such as the hitherto-used c-planes, m-planes, or a-planes. Part (b) of FIG. 14 shows the case where the laser stripe is provided (2) in the <11-20> direction and shows end faces 81c and 81d for the laser cavity along with the semipolar plane 71a. The end faces 81c and 81d are approximately perpendicular to the semipolar plane 71a and are composed of a-planes.

The fractured faces in many laser bars made by the break using method B are observed with a scanning electron microscope and it is found in each of (1) and (2) that no prominent unevenness is observed and there is little variation among the laser bars. From this result, generation of the fractured faces is stable. The flatness (magnitude of unevenness) of the fractured faces is believed to be not more than 20 nm in the area of $1.4 \times 10^{-8}$ m². Furthermore, the perpendicularity of the fractured faces to the surface of the sample is within the range of not less than −5 degrees and not more than +5 degrees.

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm and is designed so that the center wavelength of reflectance fell within the range of 500 to 530 nm. The reflecting surface on one side has ten cycles and the designed value of reflectance of about 95%, and the reflecting surface on the other side has six cycles and the designed value of reflectance of about 80%.

Evaluation by energization is carried out at room temperature. A power supply used works as a pulsed power source with the pulse width of 500 ns and the duty ratio of 0.1%, and the energization is implemented with needles on the surface electrodes. On the occasion of light output measurement, the emission from the laser bar end face is detected with a photodiode to estimate the current-light output characteristic (I-L characteristic). In measurement of emission wavelength, the emission from the laser bar end face is made to pass through an optical fiber, and a spectrum thereof is measured with a spectrum analyzer as a detector. In evaluating a polarization state, the emission from the laser bar is made to pass through a polarizing plate to rotate, thereby checking the polarization state. In observation of LED-mode emission, an optical fiber is arranged on the front surface side of the laser bar to measure light emitted from the front surface.

The polarization state in the lasing is measured for every laser, and it is found that the light is polarized in the a-axis direction. The lasing wavelength is in the range of 500-530 nm.

The polarization state in the LED mode (spontaneous emission) is measured for every laser. When the polarization component in the a-axis direction is represented as I1 and the polarization component in the projected direction of the m-axis on the primary surface is represented by I2, the polarization degree ρ is defined as (I1−I2)/(I1+I2). In this way, the relation between determined polarization degree ρ and minimum of threshold current density is investigated, and the result obtained is as shown in FIG. 9. It is seen from FIG. 9 that the threshold current density demonstrates a significant decrease in the case of the laser (1) with the laser stripe along the M-direction when the polarization degree is positive. Namely, it is seen that when the polarization degree is positive (I1>I2) and when the waveguide is provided along an off-axis direction, the threshold current density is significantly decreased.

Figure 15:
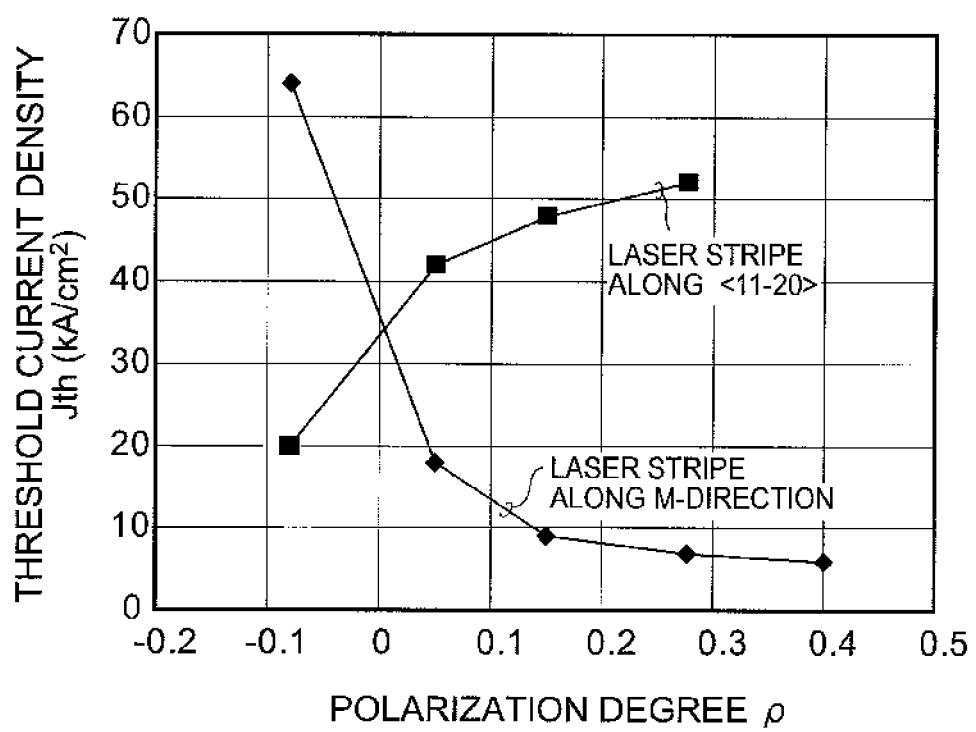
FIG. 15 is a drawing showing a relation of determined polarization degree ρ versus threshold current density.

The data shown in FIG. 15 is as described below.

| Polarization degree, | Threshold current (M-direction stripe), | Threshold current (<11-20> stripe) |
|---|---|---|
| 0.08, | 64, | 20; |
| 0.05, | 18, | 42; |
| 0.15, | 9, | 48; |
| 0.276, | 7, | 52; |
| 0.4, | 6. | |

Figure 16:
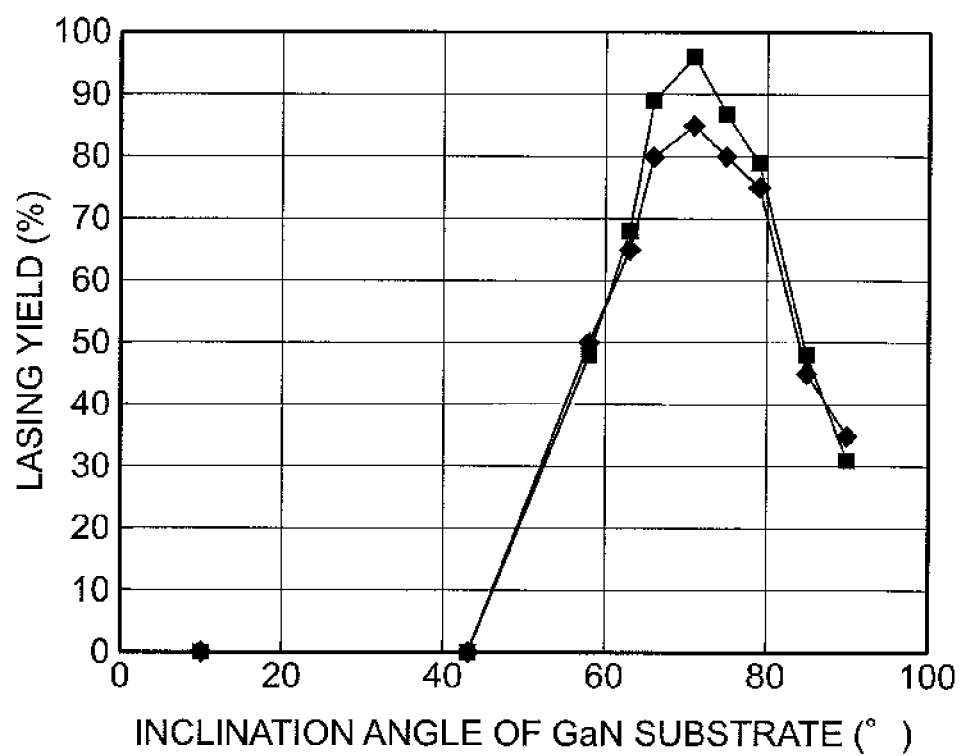
FIG. 16 is a drawing showing a relation of inclination angle of the c-axis toward the m-axis of GaN substrate versus lasing yield.

The relation between lasing yield and the inclination angle of the c-axis of the GaN substrate toward the m-axis is investigated and the result obtained is as shown in FIG. 16. In the present example, the lasing yield is defined as (the number of oscillating chips)/(the number of measured chips). FIG. 16 is a plot for substrates with the stacking fault density of substrate of not more than $1 \times 10^4$ (cm$^{-1}$) and lasers with the laser stripe along (1) the M-direction. It is seen from FIG. 16 that the lasing yield is extremely low with the off angles of not more than 45 degrees. The end face state is observed with an optical microscope, and it is found that an m-plane appeared in almost all chips, at angles smaller than 45 degrees, resulting in failure in achieving perpendicularity. It is also seen that when the off angle is in the range of not less than 63 degrees and not more than 80 degrees, the perpendicularity is improved and the lasing yield increases to 50% or more. From these facts, the optimum range of off angle of the GaN substrate is not less than 63 degrees and not more than 80 degrees. The same result is also obtained in the range of not less than 100 degrees and not more than 117 degrees, which is an angular range to provide crystallographically equivalent end faces. The data shown in FIG. 16 is as described below.

| Inclination angle, | Yield A, | Yield B. |
|---|---|---|
| 10, | 0.1, | 0.1; |
| 43, | 0.2, | 0.2; |
| 58, | 50, | 48; |
| 63, | 65, | 68; |
| 66, | 80, | 89; |
| 71, | 85, | 96; |
| 75 | 80, | 87; |
| 79, | 75, | 79; |
| 85, | 45, | 48; |
| 90, | 35, | 31. |

The yield A represents the values in the method of scribing the epitaxial surface and pressing the back surface of the substrate. The yield B represents the values in the method of scribing the back surface of the substrate and pressing the epitaxial surface. The angles are expressed in unit of "degrees."

Figure 17:
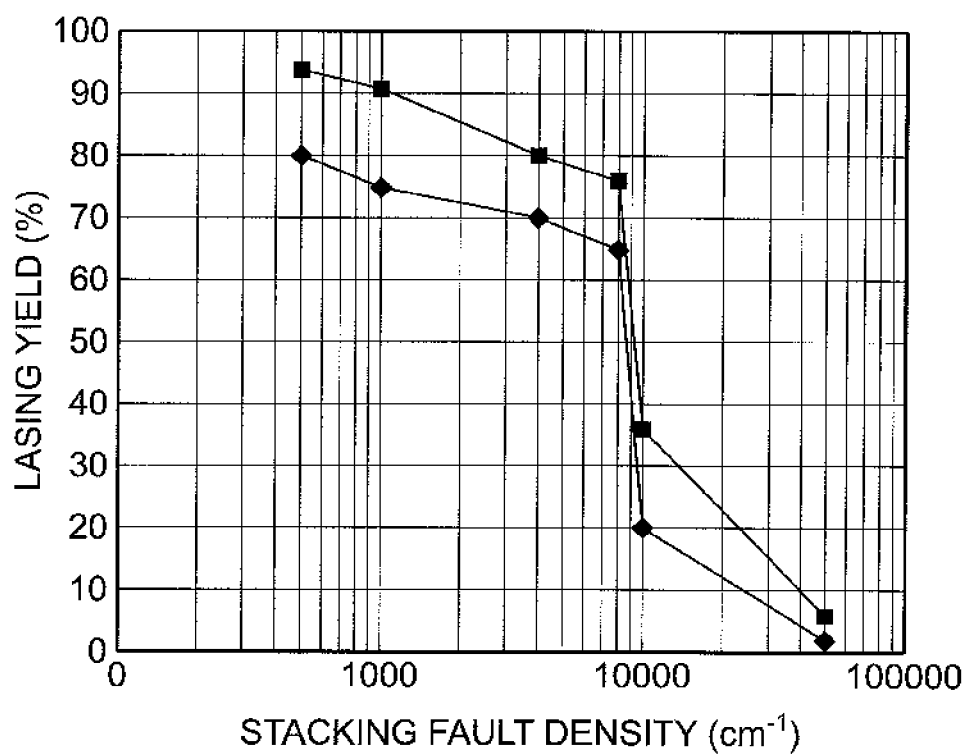
FIG. 17 is a drawing showing a relation of stacking fault density versus lasing yield.

The relation between stacking fault density and lasing yield is investigated, and the result obtained is as shown in FIG. 17. The definition of lasing yield is the same as above. It is seen from FIG. 17 that the lasing yield is suddenly decreased with the stacking fault density over $1\times10^4$ (cm$^{-1}$). When the end face state is observed with an optical microscope, it is found that with samples having the decreased lasing yield, the unevenness of the end faces is significant and no flat fractured faces are obtained. A conceivable reason is that there is a difference in easiness of fracture because of the existence of stacking faults. From this result, the stacking fault density in the substrate needs to be not more than $1\times10^4$ (cm$^{-1}$).

The data shown in FIG. 17 is as described below.

| Stacking fault density (cm$^{-1}$), | Yield A, | Yield B. |
|---|---|---|
| 500, | 80, | 94; |
| 1000, | 75, | 91; |
| 4000, | 70, | 80; |
| 8000, | 65, | 76; |
| 10000, | 20, | 36; |
| 50000, | 2, | 6. |

Figure 18:
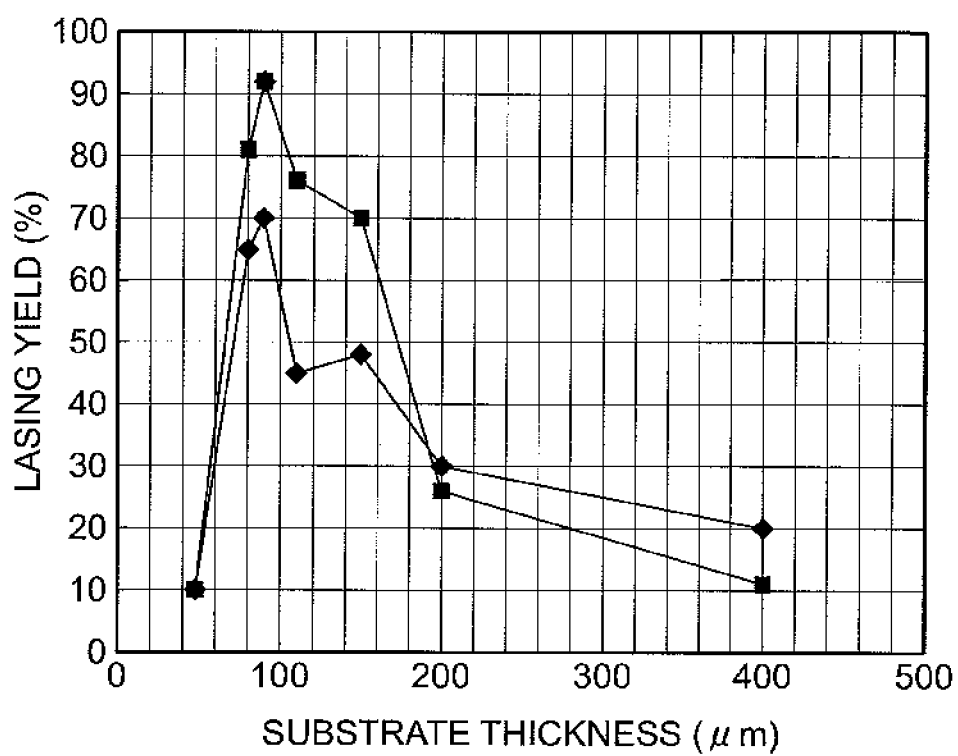
FIG. 18 is a drawing showing a relation of substrate thickness versus lasing yield.

The relation between substrate thickness and lasing yield is investigated, and the result obtained is as shown in FIG. 18. The definition of lasing yield is the same as above. FIG. 18 is a plot for lasers in which the stacking fault density of the substrate is not more than $1\times10^4$ (cm$^{-1}$) and in which the laser stripe extends along (1) the M-direction. From FIG. 18, the lasing yield is high when the substrate thickness is not more than 100 μm and not less than 50 μm. This is because the perpendicularity of fractured faces becomes deteriorated when the substrate thickness is larger than 100 μm. It is also because handling becomes difficult and a chip becomes easy to break when the thickness is smaller than 50 μm. From these, the optimum thickness of the substrate is not less than 50 μm and not more than 100 μm. The data shown in FIG. 18 is as described below.

| Substrate thickness, | Yield A, | Yield B; |
|---|---|---|
| 48, | 10, | 10; |
| 80, | 65, | 81; |
| 90, | 70, | 92; |
| 110, | 45, | 76; |
| 150, | 48, | 70; |
| 200, | 30, | 26; |
| 400, | 20, | 11. |

Example 3

In Example 2, the plural epitaxial films for the semiconductor laser are grown on the GaN substrate having the {20-21} plane. The end faces for the optical cavity are formed by the formation of scribed grooves and the press as described above. In order to find candidates for these end faces, plane orientations making an angle near 90 degrees to the (20-21) plane and being different from the a-plane are determined by calculation. With reference to FIG. 19, the following angles and plane orientations have angles near 90 degrees to the (20-21) plane.

| Specific plane index | Angle to {20-21} plane |
|---|---|
| (−1016): | 92.46 degrees; |
| (−1017): | 90.10 degrees; |
| (−1018): | 88.29 degrees. |

Figure 20:
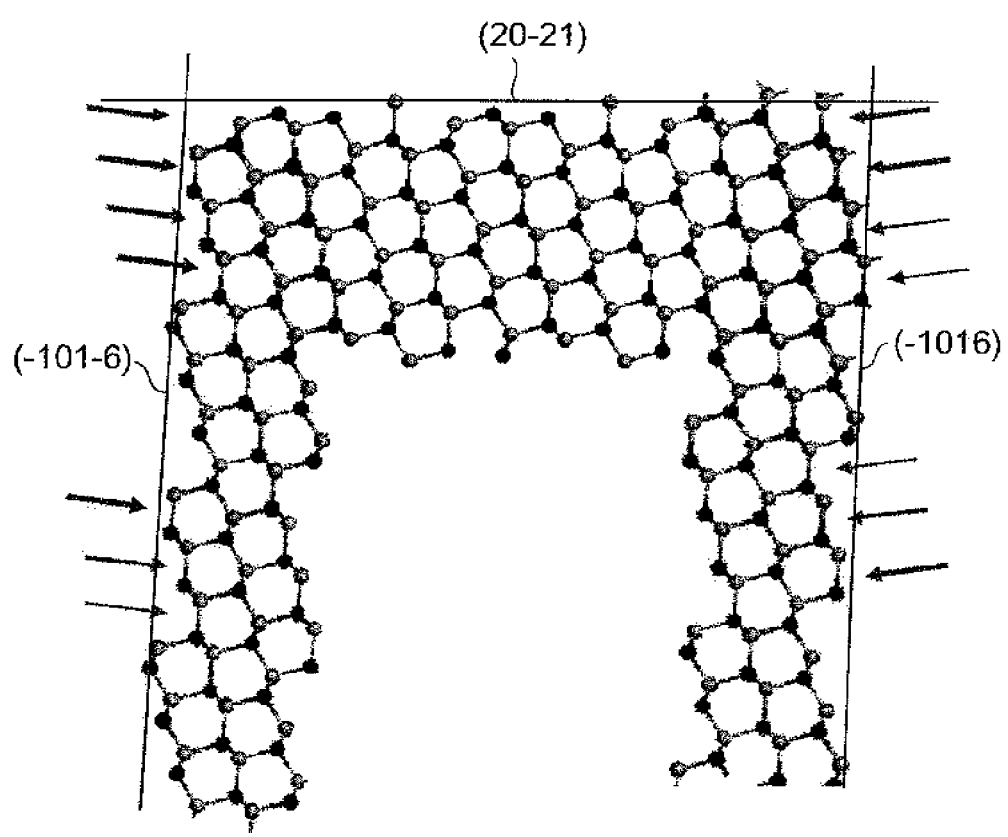
FIG. 20 is a drawing showing atomic arrangements in (20-21) plane, (−101-6) plane, and (−1016) plane.
Figure 21:
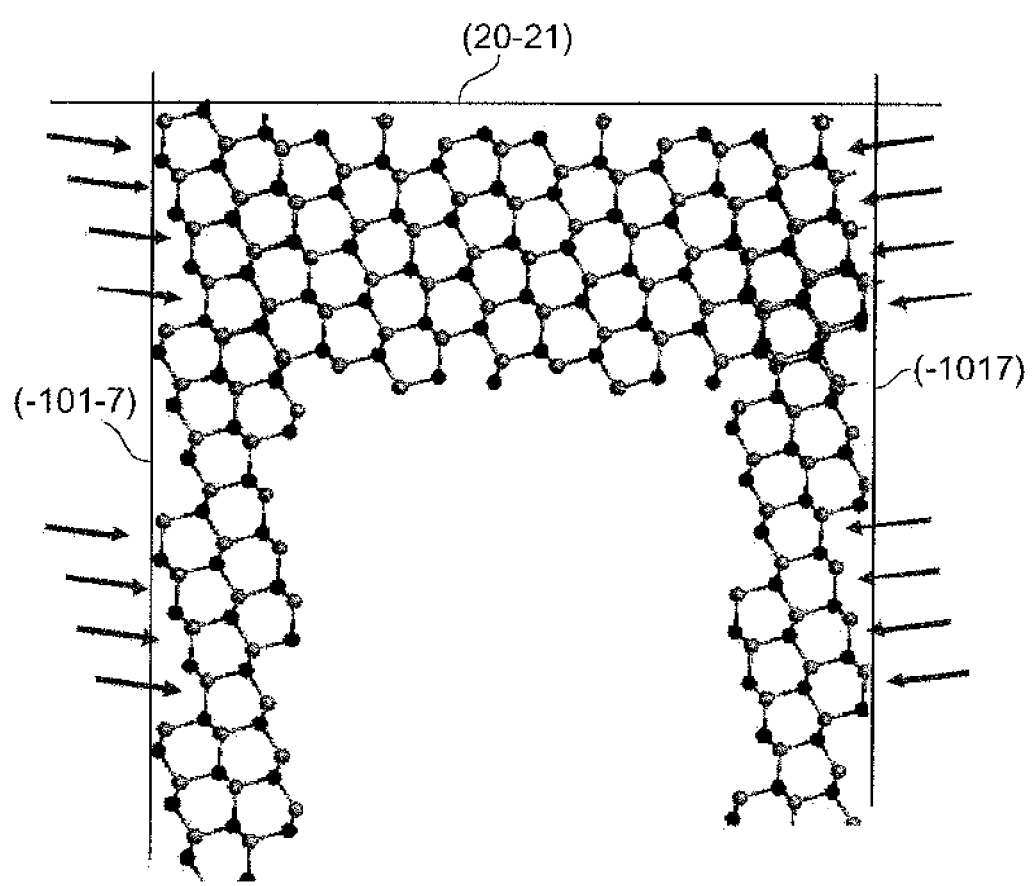
FIG. 21 is a drawing showing atomic arrangements in (20-21) plane, (−101-7) plane, and (−1017) plane.
Figure 22:
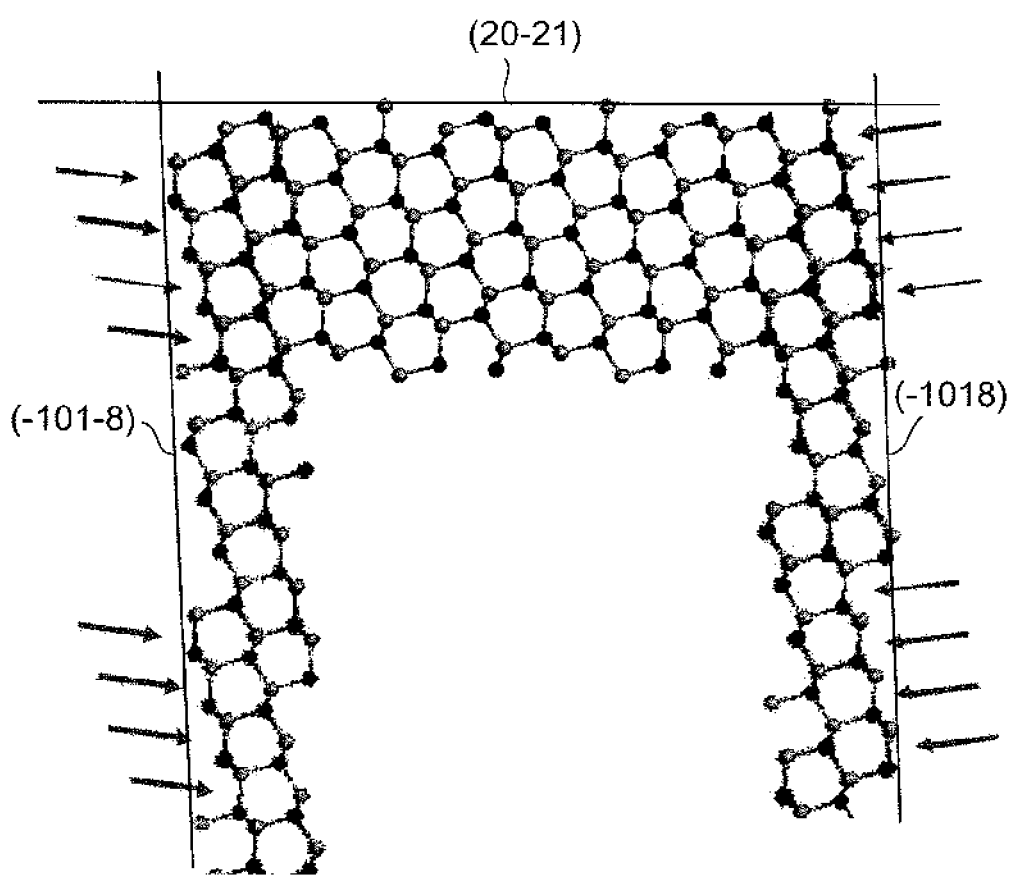
FIG. 22 is a drawing showing atomic arrangements in (20-21) plane, (−101-8) plane, and (−1018) plane.

FIG. 20 is a drawing showing arrangements of atoms in the (20-21) plane, (−101-6) plane, and (−1016) plane. FIG. 21 is a drawing showing arrangements of atoms in the (20-21) plane, (−101-7) plane, and (−1017) plane. FIG. 22 is a drawing showing arrangements of atoms in the (20-21) plane, (−101-8) plane, and (−1018) plane. As shown in FIGS. 20 to 22, local arrangements of atoms indicated by arrows show configurations of neutral atoms in terms of charge, and electrically neutral arrangements of atoms appear periodically. The reason why the relatively normal faces are obtained to the grown surface can be that generation of fractured faces is considered to be relatively stable because of the periodic appearance of the neutral atomic configurations in terms of charge.

According to various experiments including the above-described Examples 1 to 3, the angle ALPHA can be in the range of not less than 45 degrees and not more than 80 degrees or in the range of not less than 100 degrees and not more than 135 degrees. In order to improve the oscillating chip yield, the angle ALPHA can be in the range of not less than 63 degrees and not more than 80 degrees or in the range of not less than 100 degrees and not more than 117 degrees. The typical semipolar primary surface can be any one of the {20-21} plane, {10-11} plane, {20-2-1} plane, and {10-1-1} plane. Furthermore, the primary surface can be a slight slant surface from these semipolar planes. For example, the semipolar primary surface can be a slight slant surface off in the range of not less than −4 degrees and not more than +4 degrees toward the m-plane from any one of the {20-21} plane, {10-11} plane, {20-2-1} plane, and {10-1-1} plane.

As described above, the embodiment provides the III-nitride semiconductor laser device with the laser cavity exhibiting the high quality for the cavity mirrors and enabling the low threshold current, on the semipolar plane of the support base in which the c-axis of the hexagonal III-nitride is inclined toward the m-axis. The embodiment also provides the method for fabricating the III-nitride semiconductor laser device.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a III-nitride semiconductor laser device, the method comprising the steps of:
    preparing a substrate comprised of a hexagonal III-nitride semiconductor and having a semipolar primary surface;
    forming a substrate product having a laser structure, an anode electrode and a cathode electrode, the laser structure including a substrate and a semiconductor region formed on the semipolar primary surface;
    scribing a first surface of the substrate product in part in a direction of the a-axis of the hexagonal III-nitride semiconductor; and
    carrying out breakup of the substrate product by press against a second surface of the substrate product, to form another substrate product and a laser bar,
    the first surface being opposite to the second surface,
    the semiconductor region being located between the second surface and the substrate,
    the laser bar having first and second end faces, the first and second end faces extending from the first surface to the second surface, and the first and second end faces being made by the breakup,
    the first and second end faces forming a laser cavity of the III-nitride semiconductor laser device,
    the anode electrode and the cathode electrode being formed on the laser structure,
    the semiconductor region comprising a first cladding layer comprised of a first conductivity type GaN-based semiconductor, a second cladding layer comprised of a second conductivity type GaN-based semiconductor, and an active layer provided between the first cladding layer and the second cladding layer,
    the first cladding layer, the second cladding layer, and the active layer being arranged along an axis normal to the semipolar primary surface,
    the active layer comprising a GaN-based semiconductor layer,
    a c-axis of the hexagonal III-nitride semiconductor of the substrate being inclined at a finite angle ALPHA with respect to the normal axis toward an m-axis of the hexagonal III-nitride semiconductor,
    the angle ALPHA being in one of a range of not less than 45 degrees and not more than 80 degrees and a range of not less than 100 degrees and not more than 135 degrees, and
    the first and second end faces intersecting with an m-n plane defined by the normal axis and the m-axis of the hexagonal III-nitride semiconductor.

2. The method according to claim 1, wherein an end face of the active layer in each of the first and second end faces makes an angle in a range of not less than (ALPHA−5) degrees and not more than (ALPHA+5) degrees with respect to a reference plane perpendicular to the m-axis of the substrate comprised of the hexagonal nitride semiconductor, and the angle is defined on a plane defined by the c-axis and the m-axis of the hexagonal III-nitride semiconductor.

3. The method according to claim 1, wherein the angle ALPHA is in one of a range of not less than 63 degrees and not more than 80 degrees and a range of not less than 100 degrees and not more than 117 degrees.

4. The method according to claim 1, wherein forming the substrate product comprises performing processing, such as slicing or grinding of the substrate, such that a thickness of the substrate becomes not more than 400 μm, and the first surface is composed of one of a processed surface made by the processing and a surface including an electrode formed on the processed surface.

5. The method according to claim 1, wherein forming the substrate product comprises polishing the substrate so that a thickness of the substrate becomes not less than 50 μm and not more than 100 μm, and the first surface is composed of one of a polished surface formed by the polishing and a surface including an electrode formed on the polished surface.

6. The method according to claim 1, wherein a recess of the laser structure reaches the semiconductor region.

7. The method according to claim 1, wherein the scribing is carried out using a laser scriber, the scribing forms a scribed groove, and a length of the scribed groove is shorter than a length of an intersecting line between the first surface and an a-n plane defined by the normal axis and the a-axis of the hexagonal III-nitride semiconductor.

8. The method according to claim 1, wherein the semipolar primary surface is any one of a {20-21} plane, a {10-11} plane, a {20-2-1} plane, and a {10-1-1} plane.

9. The method according to claim 1, wherein the substrate is comprised of any one of GaN, AlGaN, AlN, InGaN, and InAlGaN.

10. The method according to claim 1, wherein scribing the substrate product comprise forming scribed grooves at a pitch equal to a device width of the III-nitride semiconductor laser device,
    the method further comprising the step of performing breakup of the laser bar to fabricate a III-nitride semiconductor laser device, the laser structure of the III-nitride semiconductor laser device having a pair of side faces for the III-nitride semiconductor laser device.

11. The method according to claim 1, wherein scribing the substrate product comprises forming scribed grooves at a pitch equal to a multiple of a device width of the III-nitride semiconductor laser device,
    the method further comprising a step of performing breakup of the laser bar to produce a III-nitride semiconductor laser device, the laser structure of the III-nitride semiconductor laser device having a pair of side faces for the III-nitride semiconductor laser device.

12. A method of fabricating a III-nitride semiconductor laser device, the method comprising the steps of:
    forming a substrate product having a laser structure, an anode electrode and a cathode electrode, the laser structure including a substrate comprised of a hexagonal III-nitride semiconductor and a semiconductor region formed on the semipolar primary surface of the substrate;
    scribing a first surface of the substrate product to form an array of scribed grooves;
    carrying out breakup of the substrate product by press against a first surface of the substrate product, to form another substrate product and a laser bar,
    a c-axis of the hexagonal III-nitride semiconductor of the substrate being inclined at a finite angle ALPHA with respect to the normal axis toward an m-axis of the hexagonal III-nitride semiconductor,
    the angle ALPHA being in one of a range of not less than 45 degrees and not more than 80 degrees and a range of not less than 100 degrees and not more than 135 degrees, the semiconductor region comprising a first cladding layer of a first conductivity type GaN-based semiconductor, a second cladding layer of a second conductivity type GaN-based semiconductor, and an active layer provided between the first cladding layer and the second cladding layer, the first cladding layer, the second cladding layer, and the active layer being arranged along a axis normal to the semipolar primary surface, the laser bar having first and second end faces, the first and second end faces extending from the first surface to the second surface, and the first and second end faces being made by the breakup, the first surface being opposite to the second surface, the semiconductor region being located between the second surface and the substrate, each of the scribed grooves extending along a plane that is defined by the normal axis and an a-axis of the hexagonal III-nitride semiconductor, and the first and second end faces forming a laser cavity of the III-nitride semiconductor laser device.

* * * * *